(12) United States Patent
Podhajny et al.

(10) Patent No.: US 10,724,158 B2
(45) Date of Patent: Jul. 28, 2020

(54) WOVEN FABRIC WITH CONDUCTIVE PATHS

(71) Applicant: Apple Inc., Cupertino, CA (US)

(72) Inventors: Daniel A. Podhajny, San Jose, CA (US); Daniel D. Sunshine, Sunnyvale, CA (US); Kathryn P. Crews, Menlo Park, CA (US)

(73) Assignee: Apple Inc., Cupertino, CA (US)

( * ) Notice: Subject to any disclaimer, the term of this patent is extended or adjusted under 35 U.S.C. 154(b) by 231 days.

(21) Appl. No.: 15/549,110

(22) PCT Filed: Feb. 12, 2016

(86) PCT No.: PCT/US2016/017690
§ 371 (c)(1),
(2) Date: Aug. 4, 2017

(87) PCT Pub. No.: WO2016/130888
PCT Pub. Date: Aug. 18, 2016

(65) Prior Publication Data
US 2018/0038022 A1    Feb. 8, 2018

Related U.S. Application Data

(60) Provisional application No. 62/116,283, filed on Feb. 13, 2015.

(51) Int. Cl.
*D03D 15/00* (2006.01)
*D02G 3/44* (2006.01)
(Continued)

(52) U.S. Cl.
CPC ............. *D03D 15/00* (2013.01); *D02G 3/441* (2013.01); *D10B 2101/20* (2013.01);
(Continued)

(58) Field of Classification Search
CPC ...... Y10T 442/30; D02G 3/441; H05K 1/038; H05K 2201/0281; H05K 1/0283; D10B 2101/20; D10B 2401/16
See application file for complete search history.

(56) References Cited

U.S. PATENT DOCUMENTS 3,479,565 A  *  11/1969  Rask .................. D03D 11/00
                                           361/809
5,242,768 A  *   9/1993  Nagatsuka ........... D03D 25/005
                                           139/425 R
(Continued)

FOREIGN PATENT DOCUMENTS

GB           2423998          9/2006

OTHER PUBLICATIONS

Humphries, Mary, Fabric Reference, Prentice Hall, copyright 1992 (Year: 1992).*

*Primary Examiner* — Jennifer A Steele
(74) *Attorney, Agent, or Firm* — Treyz Law Group, P.C.; G. Victor Treyz; Kendall W. Abbasi

(57) ABSTRACT

Weaving equipment may include warp strand positioning equipment that positions warp strands and weft strand positioning equipment that inserts weft strands among the warp strands to form fabric. The fabric may include insulating strands and conductive strands. Conductive strands may run orthogonal to each other and may cross at open circuit and short circuit intersections. The fabric may be formed using pairs of interwoven warp and weft strands. Conductive warp and weft strands may be interposed within the pairs of strands. The fabric may be a single layer fabric or may contain two or more layers. Stacked warp strands may be formed between pairs of adjacent insulating warp strands. The stacked warp strands may include insulating and conductive strands. Touch sensors and other compo- (Continued)

nents may include conductive structures that are formed from the conductive strands in the fabric.

15 Claims, 26 Drawing Sheets

(51) Int. Cl.
*H05K 1/02* (2006.01)
*H05K 1/03* (2006.01)

(52) U.S. Cl.
CPC ........ *D10B 2401/16* (2013.01); *H05K 1/0283* (2013.01); *H05K 1/038* (2013.01); *H05K 2201/0281* (2013.01)

(56) References Cited

U.S. PATENT DOCUMENTS

| | | | |
|---|---|---|---|
| 2003/0211797 A1* | 11/2003 | Hill | D03D 1/0088 442/205 |
| 2004/0057176 A1* | 3/2004 | Dhawan | D02G 3/38 361/62 |
| 2010/0208445 A1* | 8/2010 | Asvadi | D03D 1/0088 361/809 |
| 2010/0279572 A1 | 11/2010 | Fujita et al. | |
| 2011/0175630 A1 | 7/2011 | Bhattacharya | |
| 2016/0048236 A1* | 2/2016 | Poupyrev | G06F 3/044 345/174 |

\* cited by examiner

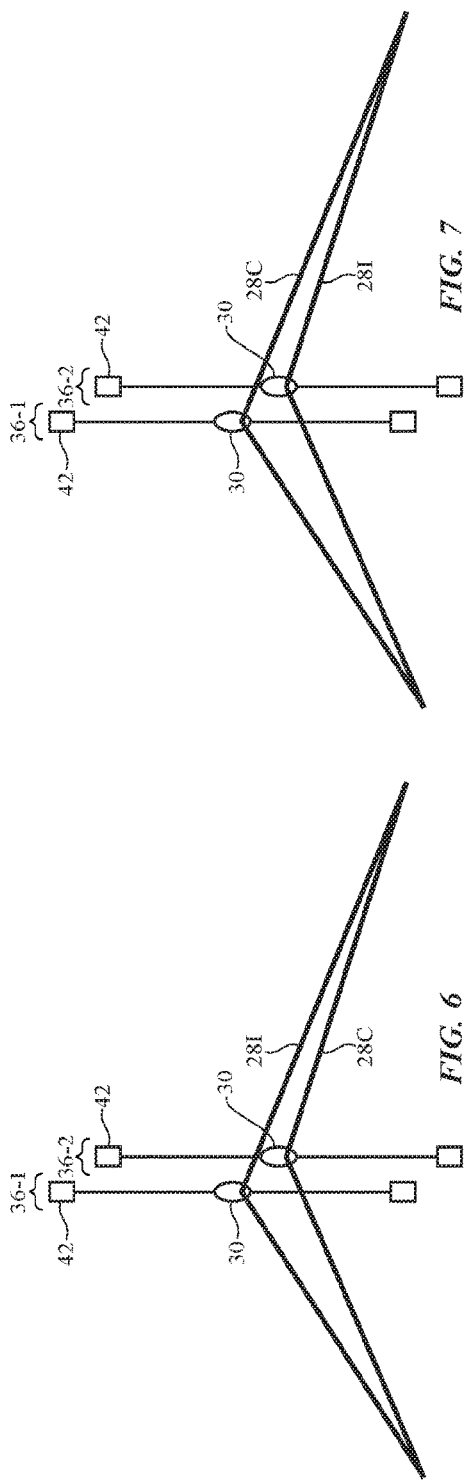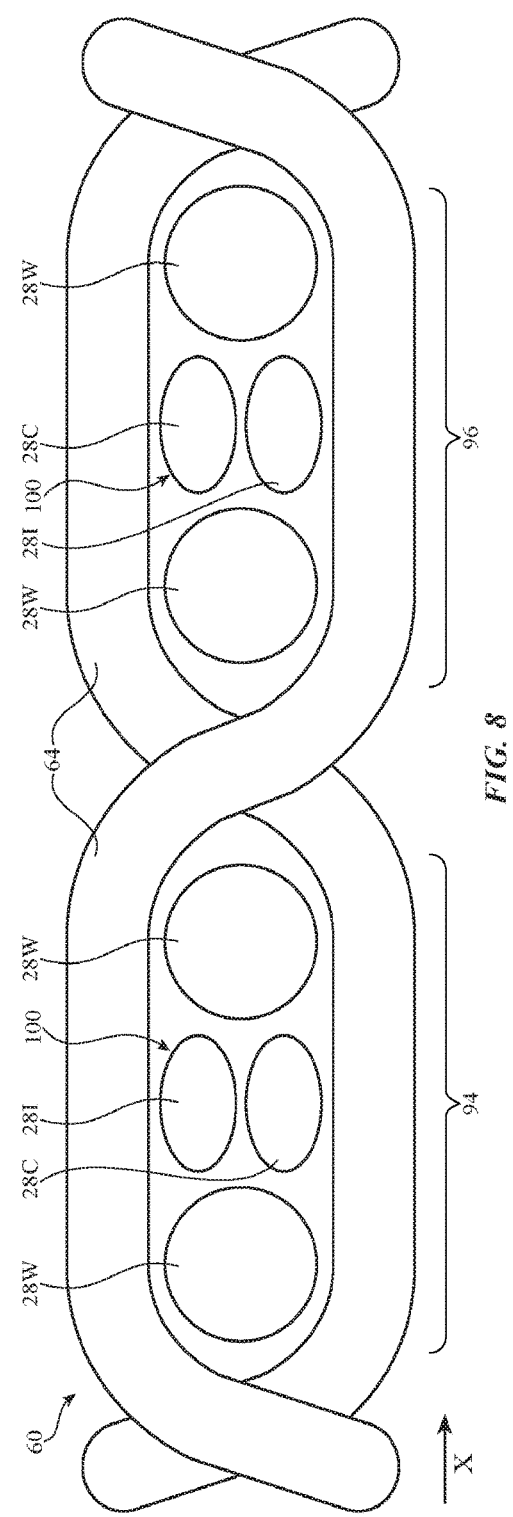

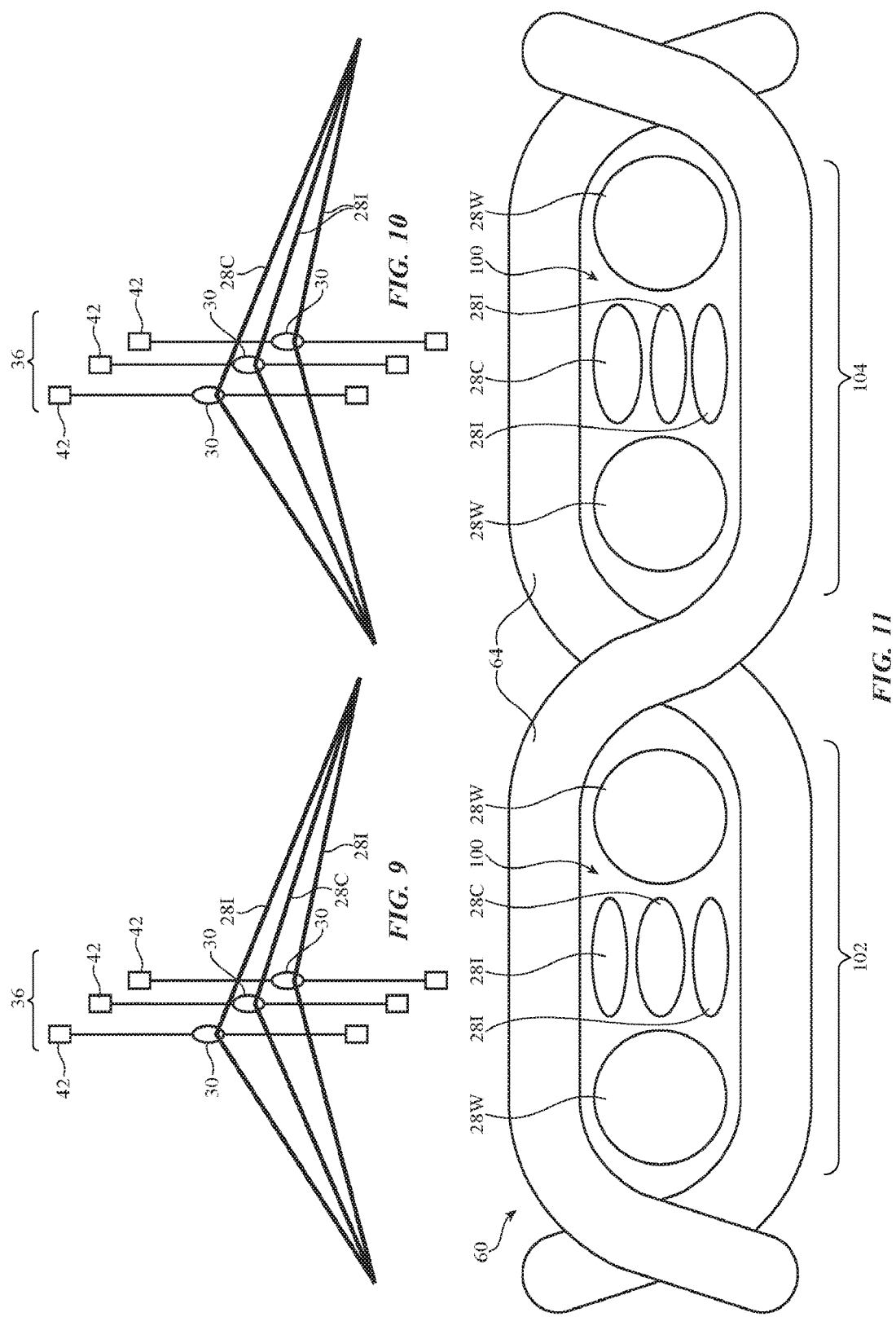

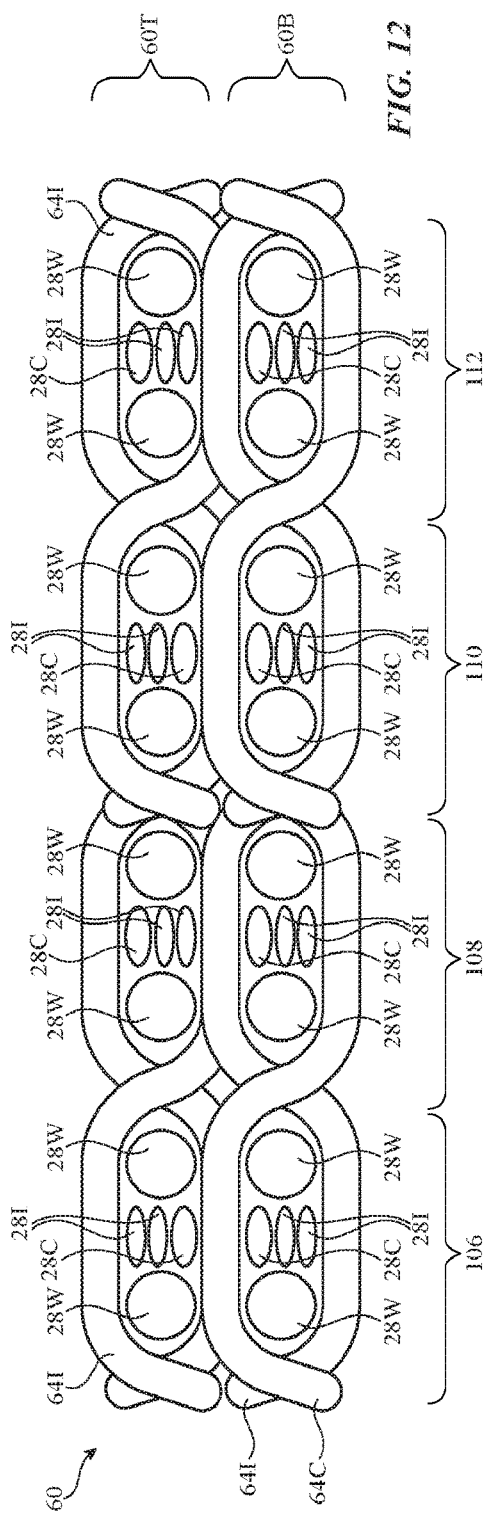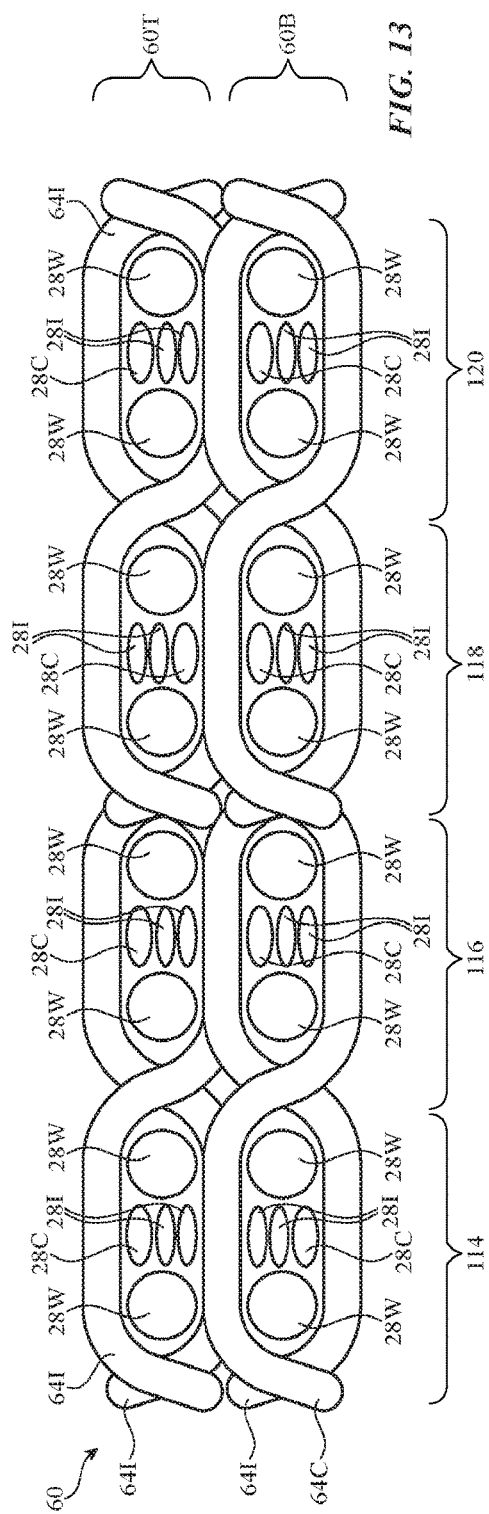

WOVEN FABRIC WITH CONDUCTIVE PATHS

This application claims priority to patent application No. 62/116,283, filed on Feb. 13, 2015, which is hereby incorporated by reference herein in its entirety.

BACKGROUND

This relates generally to weaving and, more particularly, to woven fabric that contains conductive paths.

It may be desirable to form electrical devices, enclosures, and other items from fabric. The fabric may contain strands of insulating material and strands of conductive material. In some situations, it may be desirable to form signal paths or other conductive structures from the conductive strands. Challenges may arise when forming conductive structures from conductive strands in a fabric. If care is not taken, a conductive strand in a signal path will be inadvertently shorted to conductive structures that are not intended to form part of the signal path or conductive strands in a path will be unintentionally isolated from each other. Unintended shorts and open circuits and other defects such as these such as these may prevent an item from functioning properly.

It would therefore be desirable to be able to provide improved techniques for forming conductive structures in fabric-based items.

SUMMARY

Weaving equipment may include warp strand positioning equipment that positions warp strands and weft strand positioning equipment that inserts weft strands among the warp strands to form fabric. The fabric may include insulating strands and conductive strands.

Conductive strands may run orthogonal to each other and may cross at open circuit and short circuit intersections. Intersections may be configured as open circuits or short circuits to form desired conductive paths through the fabric. The paths may be used as signal routing paths, as portions of capacitive touch sensor electrodes, as portions of resistive sensors, or as portions of any other conductive structures for a fabric-based item.

The fabric may be formed using pairs of warp strands that have been interwoven with pairs of weft strands. In this type of fabric, conductive warp and weft strands may be interposed within the pairs of strands and selectively coupled or isolated from each other at intersections within the fabric.

The fabric may be a single layer fabric or may contain two or more layers. In some arrangements, stacked warp strands may be formed between pairs of adjacent insulating warp strands. The stacked warp strands may include insulating and conductive strands. The conductive strands in the stacked strands may be selectively sandwiched between opposing insulating strands or moved to the top or the bottom of the stack so that a conductive strand makes contact with an orthogonal conductive strand or is exposed on a desired fabric surface.

BRIEF DESCRIPTION OF THE DRAWINGS

FIGS. 6 and 7 show healds in a weaving system in accordance with an embodiment.

FIG. 8 shows fabric having strand stacks with two strands being formed using the heald configurations of FIGS. 6 and 7 in accordance with an embodiment.

FIGS. 9 and 10 show healds in a weaving system, and FIG. 11 shows a fabric formed using the healds of FIGS. 9 and 10 in accordance with another embodiment.

FIGS. 12 and 13 are cross-sectional side views of illustrative two layer fabrics in accordance with an embodiment.

DETAILED DESCRIPTION

Conductive strands of material and insulating strands of material may be used in forming fabric with conductive paths. The conductive paths may be used in forming signal paths (e.g., signal busses, power lines, etc.), may be used in forming part of a capacitive touch sensor electrode, a resistive touch sensor electrode, or other input-output device, or may be used in forming other patterned conductive structures. The conductive structures may be used in carrying power signals, digital signals, analog signals, sensor signals, control signals, data, input signals, output signals, or other suitable electrical signals.

Figure 1:
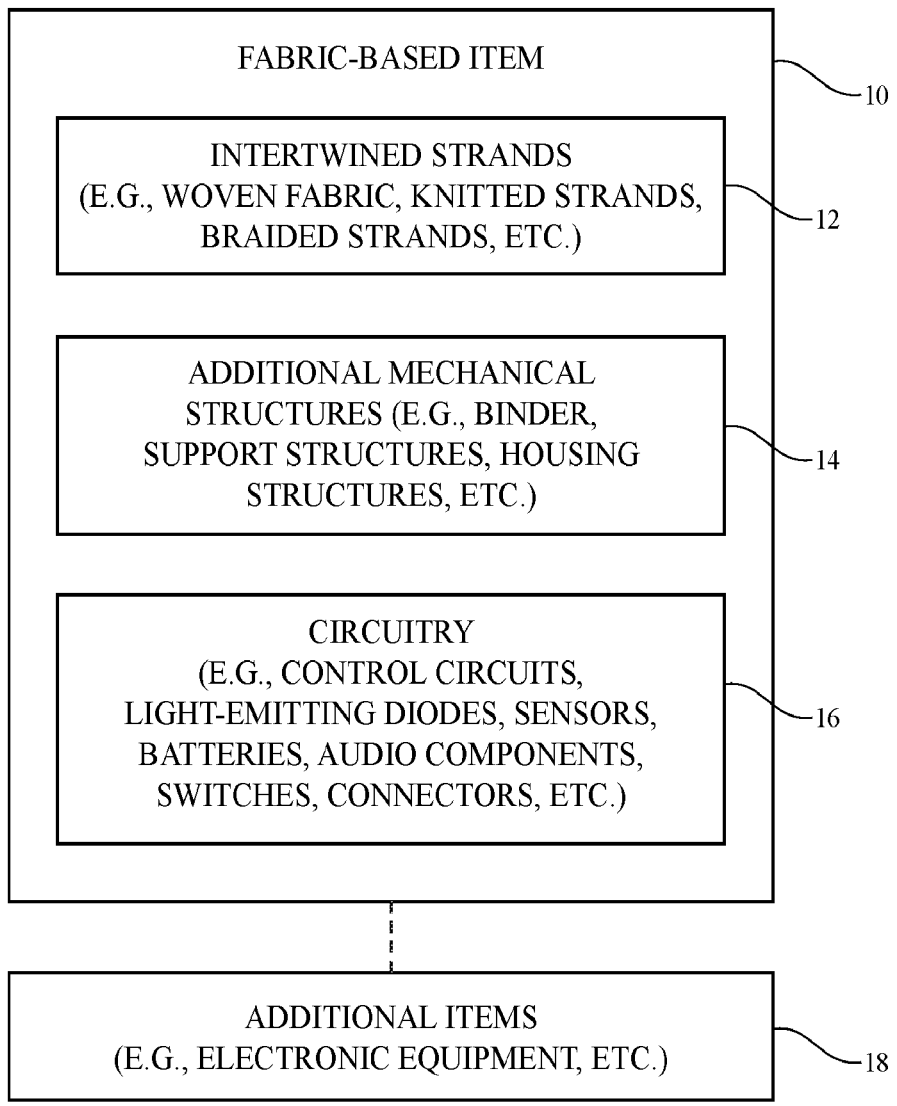
FIG. 1 is a schematic diagram of an illustrative strand-based item in accordance with an embodiment.

The fabric containing these conductive structures may be used in forming a fabric-based item such as illustrative fabric-based item 10 of FIG. 1. Item 10 may be an electronic device or an accessory for an electronic device such as a laptop computer, a computer monitor containing an embedded computer, a tablet computer, a cellular telephone, a media player, or other handheld or portable electronic device, a smaller device such as a wrist-watch device, a pendant device, a headphone or earpiece device, a device embedded in eyeglasses or other equipment worn on a user's head, or other wearable or miniature device, a television, a computer display that does not contain an embedded computer, a gaming device, a navigation device, an embedded system such as a system in which fabric-based item 10 is mounted in a kiosk, in an automobile, airplane, or other vehicle, other electronic equipment, or equipment that implements the functionality of two or more of these devices. If desired, item 10 may be a removable external case for electronic equipment, may be a strap, may be a wrist band or head band, may be a removable cover for a device, may be a case or bag that has straps or that has other structures to receive and carry electronic equipment and other items, may be a necklace or arm band, may be a wallet, sleeve, pocket, or other structure into which electronic equipment or other items may be inserted, may be part of a chair, sofa, or other seating (e.g., cushions or other seating structures), may be part of an item of clothing or other wearable item (e.g., a hat, belt, wrist band, headband, etc.), or may be any other suitable fabric-based item.

Strands in item 10 may form all or part of a housing wall for an electronic device, may form internal structures in an electronic device, or may form other strand-based structures. Item 10 may be soft (e.g., item 10 may have a fabric surface that yields to a light touch), may have a rigid feel (e.g., the surface of item 10 may be formed from a stiff fabric), may be coarse, may be smooth, may have ribs or other patterned textures, and/or may be formed as part of a device that has portions formed from non-fabric structures of plastic, metal, glass, crystalline materials, ceramics, or other materials.

Item 10 may include intertwined strands 12. The strands may be intertwined using strand intertwining equipment such as weaving equipment, knitting equipment, or braiding equipment. Intertwined strands 12 may, for example, form woven fabric.

Strands 12 may be single-filament strands (sometimes referred to as fibers) or may be threads, yarns, or other strands that have been formed by intertwining multiple filaments of material together. Strands may be formed from polymer, metal, glass, graphite, ceramic, natural strands such as cotton or bamboo, or other organic and/or inorganic materials and combinations of these materials. Conductive coatings such as metal coatings may be formed on non-conductive strands (e.g., plastic cores) to make them conductive. Reflective coatings such as metal coatings may be applied to strands to make them reflective. Strands 12 may also be formed from single-filament metal wire (e.g., bare metal wire), multifilament wire, or combinations of different materials. Strands may be insulating or conductive.

Strands 12 may be conductive along their entire length or may have conductive segments. Strands 12 may have metal portions that are selectively exposed by locally removing insulation (e.g., to form connections with other conductive strand portions). Strands 12 may also be formed by selectively adding a conductive layer to a portion of a non-conductive strand.). Threads and other multifilament yarns that have been formed from intertwined filaments may contain mixtures of conductive strands and insulating strands (e.g., metal strands or metal coated strands with or without exterior insulating layers may be used in combination with solid plastic strands or natural strands that are insulating).

Conductive strands (complete conductive strands and/or conductive strand segments) that cross other conductive strands may be shorted to each other to form a portion of a signal path. Electrical connections of this type may be formed by virtue contacting a first conductive strand with a second conductive strand.

Item 10 may include additional mechanical structures 14 such as polymer binder to hold strands 12 together, support structures such as frame members, housing structures (e.g., an electronic device housing), and other mechanical structures.

To enhance mechanical robustness and electrical conductivity at strand-to-strand connections, additional structures and materials (e.g., solder, crimped metal connections, welds, conductive adhesive, non-conductive adhesive, fasteners, etc.) may be used to help form strand-to-strand connections at strand intersections where connections are desired. Insulating material can be interposed between intersecting conductive strands at locations in which it is not desired to form a strand-to-strand connection. The insulating material may be plastic or other dielectric, may include an insulating strand or a conductive strand with an insulating coating, etc.

Circuitry 16 may be included in item 10. Circuitry 16 may include components that are coupled to strands 12, components that are housed within an enclosure formed by strands 12, components that are attached to strands 12 using welds, solder joints, adhesive bonds (e.g., conductive adhesive bonds), crimped connections, or other electrical and/or mechanical bonds. Circuitry 16 may include metal structures for carrying current, integrated circuits, discrete electrical components such as resistors, capacitors, and inductors, switches, connectors, light-emitting components such as light-emitting diodes, audio components such as microphones and speakers, vibrators, solenoids, piezoelectric devices, and other electromechanical devices, connectors, microelectromechanical systems (MEMs) devices, pressure sensors, light detectors, proximity sensors, force sensors, moisture sensors, temperature sensors, accelerometers, gyroscopes, compasses, magnetic sensors, touch sensors, and other sensors, components that form displays, touch sensors arrays (e.g., arrays of capacitive touch sensor electrodes to form a touch sensor that detects touch events in two dimensions), and other input-output devices. Circuitry 16 may also include control circuitry such as non-volatile and volatile memory, microprocessors, application-specific integrated circuits, system-on-chip devices, baseband processors, wired and wireless communications circuitry, and other integrated circuits.

Item 10 may interact with electronic equipment or other additional items 18. Items 18 may be attached to item 10 or item 10 and item 18 may be separate items that are configured to operate with each other (e.g., when one item is a case and the other is a device that fits within the case, etc.). Circuitry 16 may include antennas and other structures for supporting wireless communications with item 18. Item 18 may also interact with item 10 using a wired communications link or other connection that allows information to be exchanged.

In some situations, item 18 may be an electronic device such as a cellular telephone, computer, or other portable electronic device and item 10 may form a case or other structure that receives the electronic device in a pocket, an interior cavity, or other portion of item 10. In other situations, item 18 may be a wrist-watch device or other electronic device and item 10 may be a strap or other fabric-based item that is attached to item 18. In still other situations, item 10 may be an electronic device, strands 12 may be used in forming the electronic device, and additional items 18 may include accessories or other devices that interact with item 10. Signal paths formed from conductive strands may be used to route signals in item 10 and/or item(s) 18.

The strands that make up item 10 may be intertwined using any suitable strand intertwining equipment. With one suitable arrangement, which may sometimes be described herein as an example, strands 12 may be woven together to form a woven fabric. The fabric may have a plain weave, a satin weave, a twill weave, or variations of these weaves, may be a three-dimensional woven fabric, or may be other suitable fabric.

Figure 2:
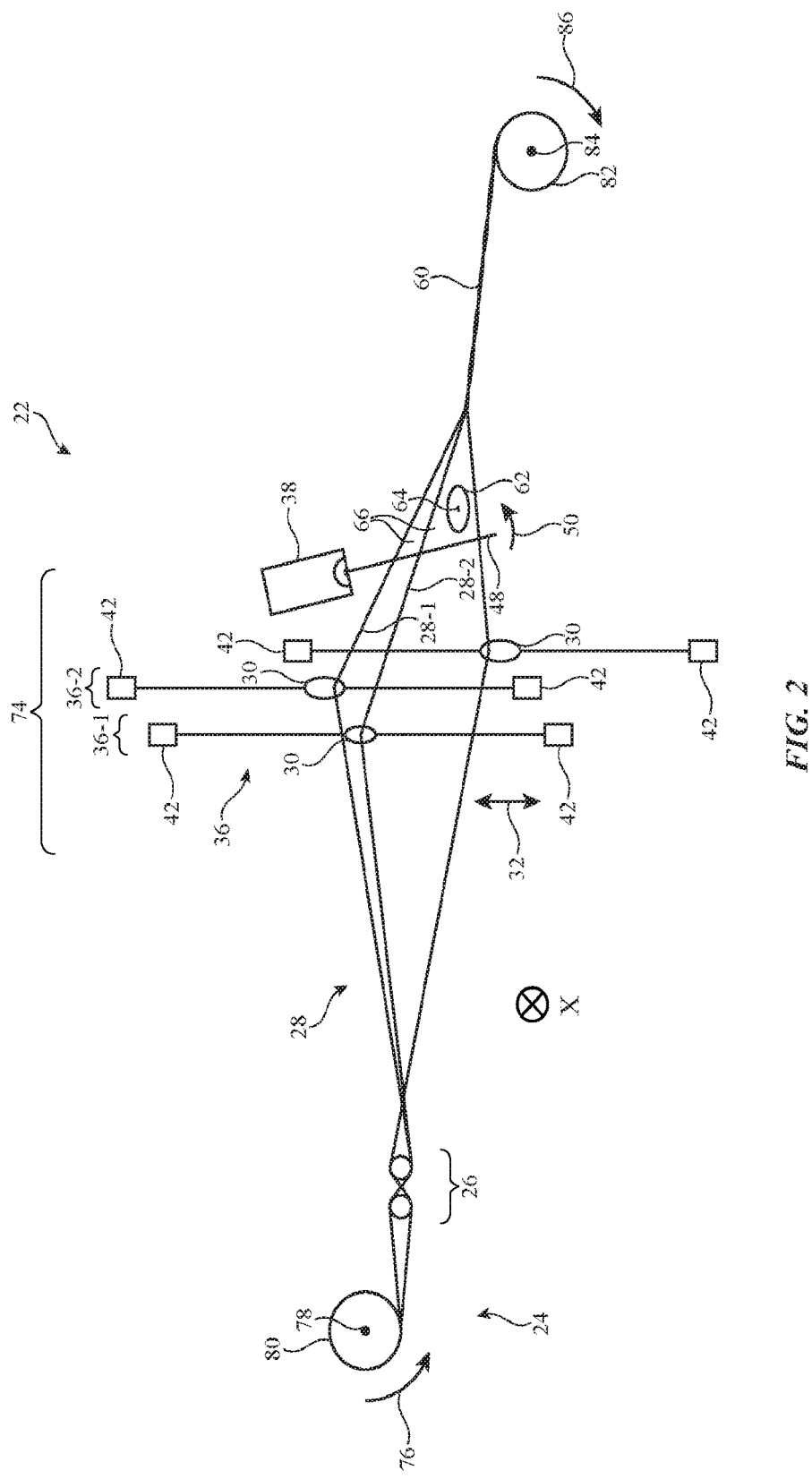
FIG. 2 is a side view of illustrative weaving equipment that may be used to form fabric in accordance with an embodiment.

Illustrative weaving equipment for forming woven fabric for items such as item 10 of FIG. 1 is shown in FIG. 2. During weaving, fabric may be formed using strands such as strands 12 of FIG. 1. The strands may be single filaments of material or may be threads, yarns, or other multifilament strands that have been formed by intertwining multiple single-filament strands. Strands may be formed from insulating materials, conductive materials, and combinations of insulating and conductive materials. The strands that are used include warp strands 28 and weft strands 64.

As shown in FIG. 2, weaving equipment 22 includes a warp strand source such as warp strand source 24. Source 24 may supply warp strands 28 from a warp beam or other strand dispensing structure. Source 24 may, for example, dispense warp strands 28 through rollers 26 and other mechanisms as drum 80 rotates about rotational axis 78 in direction 76.

Warp strands 28 may be positioned using warp strand positioning equipment 74. Equipment 74 may include healds (heddles) 36. Healds 36 may each include an eye 30 mounted on a wire or other support structure that extends between respective positioners 42 (or a positioner 42 and an associated spring or other tensioner). Positioners 42 may be motors (e.g., stepper motors) or other electromechanical actuators. Positioners 42 may be controlled by a controller during weaving operations so that warp strands 28 are placed in desired positions in the fabric being woven. In particular, control circuitry in weaving equipment 22 may supply control signals that move each heald 36 by a desired amount (e.g., up or down in directions 32). By raising and lowering healds 36 in various patterns in response to control signals from the control circuitry, different patterns of gaps (sheds) 66 between warp strands 28 may be created and warp strands 28 can be placed at different vertical positions within fabric 60.

Weft strands such as weft strand 64 may be inserted into shed 66 during weaving to form fabric 60. Weft strand positioning equipment 62 may be used to place one or more weft strands 64 between the warp strands forming each shed 66. Weft strand positioning equipment 62 may include one or more shuttles or may include shuttleless weft strand positioning equipment (e.g., needle weft strand positioning equipment, rapier weft strand positioning equipment, or other weft strand positioning equipment such as equipment based on projectiles, air or water jets, etc.).

After each pass of weft strand 64 is made through shed 66, reed 48 may be moved in direction 50 by positioner 38 to push the weft strand that has just been inserted into the shed between respective warp strands 28 against previously woven fabric 60, thereby ensuring that a satisfactorily tight weave is produced. Fabric 60 that has been woven in this way may be gathered on fabric collection equipment such as take-down roller 82. Roller 82 may collect woven fabric 60 as roller 82 rotates in direction 86 about rotational axis 84. Reed 48 and weft strand positioning equipment 62 may be controlled by the control circuitry that controls healds 36, so that warp strand position, weft strand positioning, and reed movement can be controlled in a coordinated fashion.

To control the vertical position of warp strands 28 within fabric 60, some of healds 36 such as illustrative healds 36-1 and 36-2 may be aligned along dimension X. In this configuration, the warp strands that are dispensed from these healds will be dispensed into the same warp strand position in fabric 60. When the eye in heald 36-1 is raised above the eye in heald 36-2, warp strand 28-1 will be incorporated into fabric 60 above warp strand 28-2 (i.e., strands 28-1 and 28-2 will be aligned with respect to axis X, which extends into the page in the example of FIG. 2, and strand 28-1 will lie on top of strand 28-2). Similarly, when heald 36-2 is raised above heald 36-1, as shown in FIG. 2, warp strand 28-2 will be incorporated into fabric 60 above warp strand 28-1. The ability to determine which warp strands are located on or near the top of fabric 60 and which strands are located on or near the bottom of fabric 60 allows conductive and insulating strands to be manipulated within fabric 60 so that short circuits and open circuits are selectively formed at various warp-weft strand intersections. This allows conductive structures such as signal paths (e.g., electrodes, data lines, power paths, etc.) to be formed in fabric 60 from a desired pattern of coupled horizontal and vertical conductive strand segments.

Some or all of healds 36 may be independently positioned and/or some of healds 36 may contain eyes 30 that are mounted on a common wire. In configurations for weaving equipment 22 in which eyes 30 are mounted on a common wire, the warp strands dispensed through the eyes will be aligned with respect to each other (i.e., their positions along dimension X of FIG. 2 will be the same) and a movable needle or other controllable strand positioning member may be used to manipulate the upper and lower warp threads to determine which warp thread is located above the other. The use of independently adjustable healds 36 (including some independently adjustable healds 36 that are laterally aligned across warp strands 28 such as healds 36-1 and 36-2) is merely illustrative. Any suitable technique for determining the order in which warp threads 28 are stacked on top of each other within fabric 20 at a given warp strand position may be used, if desired.

Figure 3:
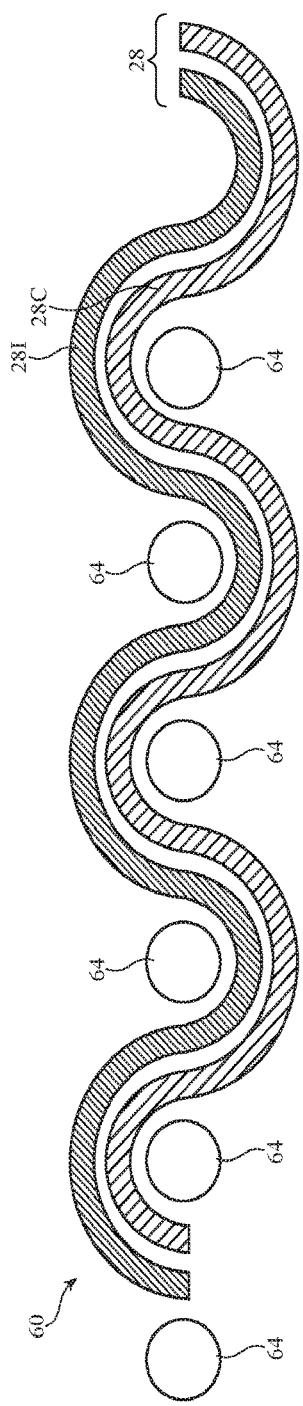
FIGS. 3, 4, and 5 are side views of illustrative fabric in which conductive and insulating strands are positioned at different locations in the fabric in accordance with an embodiment.
Figure 4:
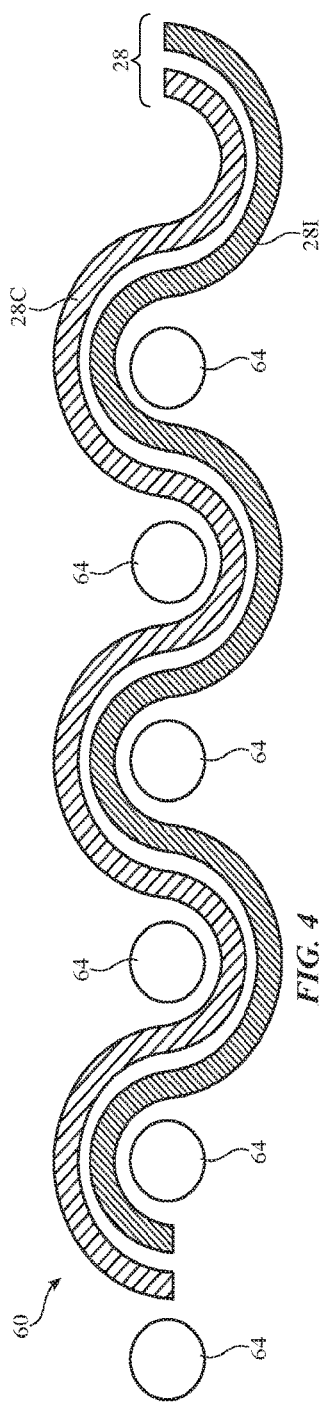
Figure 5:
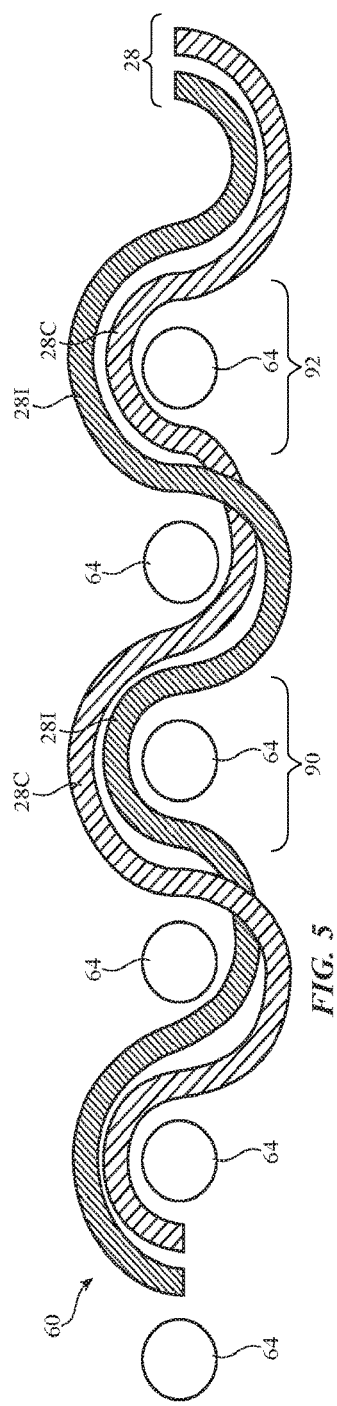

FIGS. 3, 4, and 5 illustrate how warp strand positioning techniques may be used in fabricating fabric 60 with insulating and conducting strands 28. In the examples of FIGS. 3, 4, and 5, warp strands 28 have been woven with weft strands 64 to form fabric 60. Warp strands 28 include conductive strands such as conductive strand 28C and insulating strands such as insulating strand 28I. In the example of FIG. 3, warp strand 28I has been positioned above warp strand 28C, so the upper surface of fabric 60 is insulating and the lower surface of fabric 60. In the example of FIG. 4, equipment 22 has been used to stack warp strand 28I below warp strand 28C, so the upper surface of fabric 60 is conductive and the lower surface of fabric 60 is insulating. If desired, fabric 60 may have a surface that is insulating in some areas and conductive in others. In the example of FIG. 5, the upper (front) surface of fabric 60 in area 90 is conductive, because conductive strand 28C is located above insulating strand 28I in area 90, whereas the upper surface of fabric 60 is insulating in area 92, because strand 28I is located above strand 28C in area 92.

Warp strands 28 may be stacked vertically in different patterns by controlling healds 36-1 and 36-2. Consider, as an example, the heald positions of FIGS. 6 and 7. When healds 36-1 and 36-2 are positioned as shown in FIG. 6, strand 28I will be positioned above strand 28C. When healds 36-1 and 36-2 are positioned as shown in FIG. 7, strand 28C will be positioned above strand 28I.

In fabric 60 of FIG. 8, healds 36-1 and 36-2 were positioned in the configuration of FIG. 6 when forming fabric area 94 and were positioned in the configuration of FIG. 7 when forming fabric area 96. To help ensure that warp strands 28I and 28C stack vertically on top of each other as shown in FIG. 8, fabric 60 may be provided with laterally supporting warp strands 28W (sometimes referred to as wall warp strands or guide warp strands). Wall warp strands 28W may be insulating strands. Wall warp strands 28W may flank centrally located and vertically stacked strands 28I and 28C on the left and right, thereby preventing strands 28I and 28C from deviating to the left or right along axis X and therefore becoming unstacked as fabric 60 is formed. In the illustrative configuration of FIG. 8, there is a single wall strand 28W on the left and on the right of each set of stacked warp strands, but more than one wall strand may be provided on each side of the warp strand stack if desired. Wall strands 28W may be larger than the central stacked warp strands (as an example).

There are only two stacked warp strands between an opposing pair of upper and lower weft strands 64 in fabric 60 of FIG. 8, but there may be three or more stacked warp strands in the lateral gap 100 between opposing wall strands 28W. For example, portion 102 of fabric 60 of FIG. 11 may be formed when the healds that are dispensing warp strands into gap 100 between wall strands 28W in portion 102 are oriented as shown by illustrative healds 36 of FIG. 9. Other portions such as portion 104 of fabric 60 of FIG. 11 may be formed when the healds that are dispensing warp strands into gap 100 between wall strands 28W in portion 104 are oriented as shown by illustrative healds 36 of FIG. 10.

In portion 102, conductive strand 28C is insulated above and below by insulating strands 28I. In portion 104, conductive strand 28C is exposed on the upper surface of fabric 60 (e.g., to form a touch sensor or other electrode, etc.) and may, if desired, contact an overlapping conductive weft strand.

If desired, weft strands 64 and wall strands 28W of FIGS. 8 and 11 may be insulating. One or more of strands 64 and 28W may be conducting to help form a signal path or other conductive structure in fabric 60. As one example, the warp strand that touches conductive upper warp strand 28C in region 104 may be conductive so that an electrical warp-to-weft connection is formed with upper warp strand 28C.

Fabric 60 may have two or more layers. In the illustrative configurations of FIGS. 12 and 13, fabric 60 has a two layer configuration including an upper layer such as layer 60T and a lower layer such as layer 60B. Wall strands 28W may be insulating. Insulating warp strands 28I and conductive warp strands 28C may be stacked in various patterns within the gap formed between adjacent wall strands 28W. The weft strands in fabric 60 may include insulating weft strands 64I and conductive weft strands 64C.

Using equipment 22, fabric 60 may be formed that has desired warp-to-weft electrical connections at the intersections between conductive warp and weft strands. As shown in FIG. 12, for example, conductive warp strands 28C may be brought into contact with conductive weft strand 64C in regions such as regions 106 and 110, so that warp-to-weft connections (short circuits) are formed. Insulating warp strands 28I may be interposed between conductive warp strands 28C and conductive weft strand 64C in regions such as regions 108 and 112, so that the warp and weft strands are electrically isolated from each other at the intersections of the conductive warp and weft strands in these regions (i.e., open circuits are formed).

Similarly, in the example of FIG. 13, warp strands 28C may be isolated from weft strand 64C in regions 114, 116, and 120, whereas the warp strands 28C in region 118 may be electrically shorted to weft strand 64C.

During weaving, equipment 22 can modify fabric 60 so that different areas of the fabric have different constructions (e.g., different patterns of warp strand stacks) and therefore have desired properties in these areas.

Figure 14:
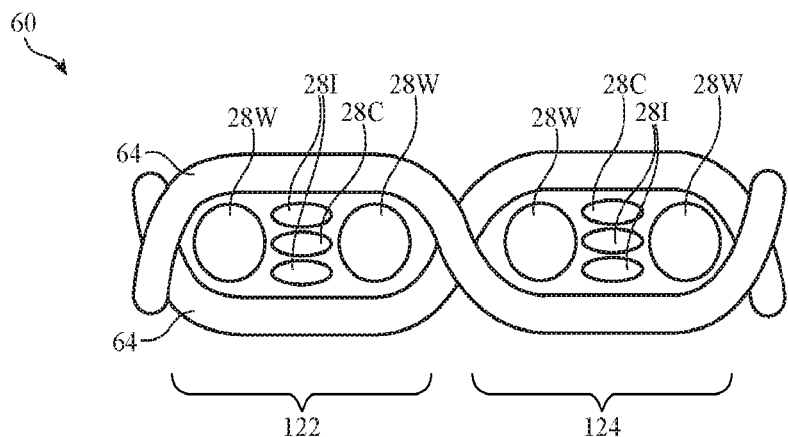
FIGS. 14 and 15 are cross-sectional side views of illustrative fabric with different stacked strand patterns in accordance with an embodiment.
Figure 15:
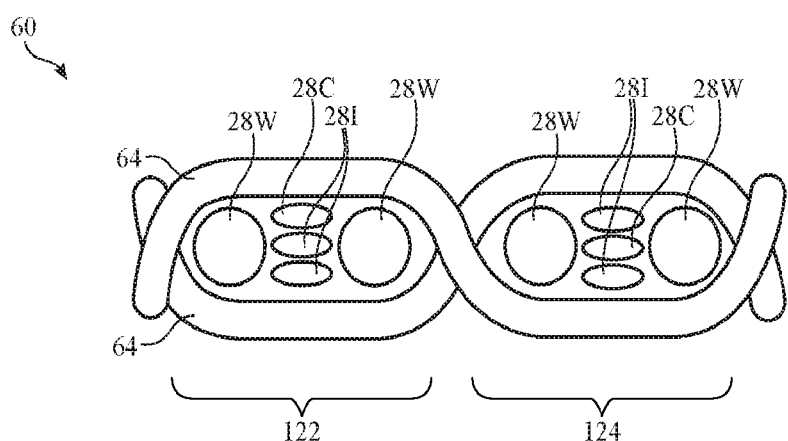

The process of changing the positions of warp strands 28 within the warp strand stacks between wall strands 28W to selectively alter the configuration of fabric 60 in different regions of fabric 60 is illustrated in connection with FIGS. 14-27. FIG. 14 shows two regions of an illustrative fabric at the beginning of a pick in which the orientation of the stacked warp strands is being adjusted and FIG. 15 shows the same two regions at the end of the pick. FIGS. 16-27 show the movement of the strands at various different times during the pick.

As shown in FIG. 14, conductive warp strand 28C is initially sandwiched between upper and lower insulating warp strands 28I in region 122, whereas conductive warp strand 28C is exposed at the top of the warp strand stack in region 124. At the completion of the pick, conductive warp strand 28C in region 122 has been moved to the top of the stack and conductive warp strand 28C has been moved to an insulated position in the center of the stack in region 124.

An illustrative set of steps for accomplishing this type of warp strand movement by adjustment of healds 36 in equipment 22 is shown in FIGS. 16-27.

Figure 16:
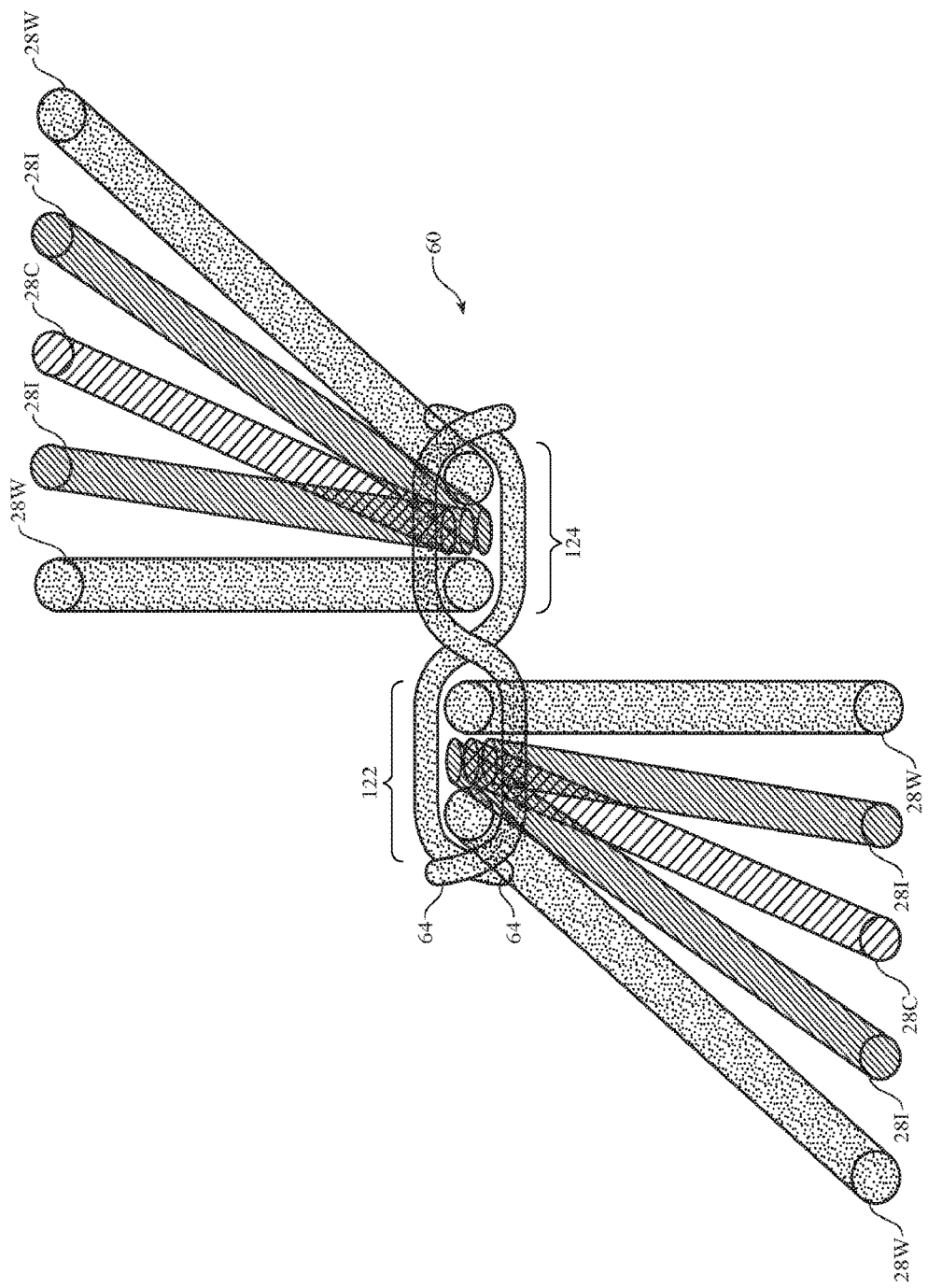
FIGS. 16, 17, 18, 19, 20, 21, 22, 23, 24, 25, 26, and 27 show process steps involved in weaving fabric of the type shown in FIGS. 14 and 15 in accordance with an embodiment.

Initially, as shown in FIG. 16, wall strands 28W, warp strands 28I, and warp strand 28C in region 122 are moved down and wall strands 28W, warp strands 28I, and warp strand 28C in region 124 are moved up.

Figure 17:
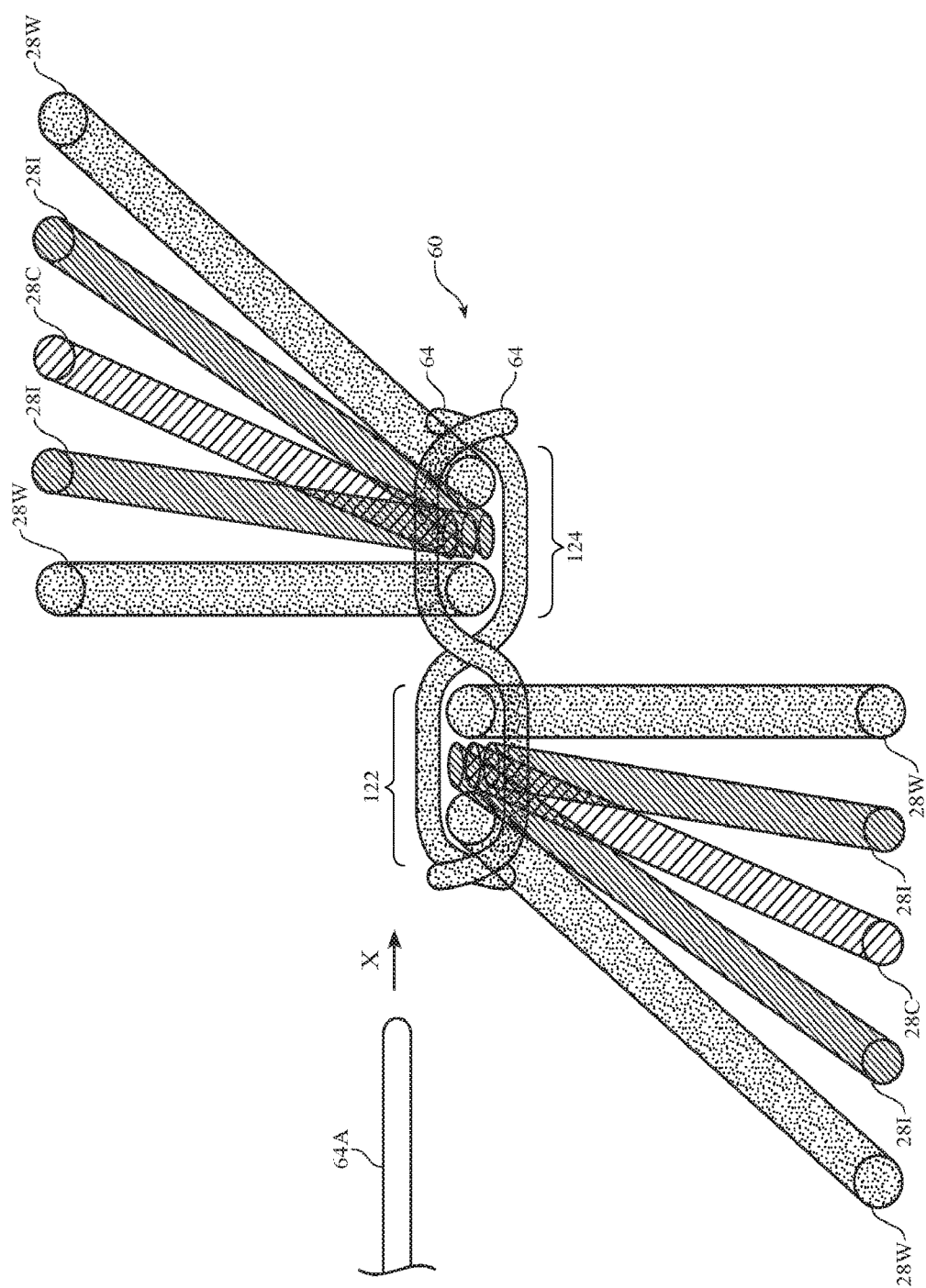
Figure 18:
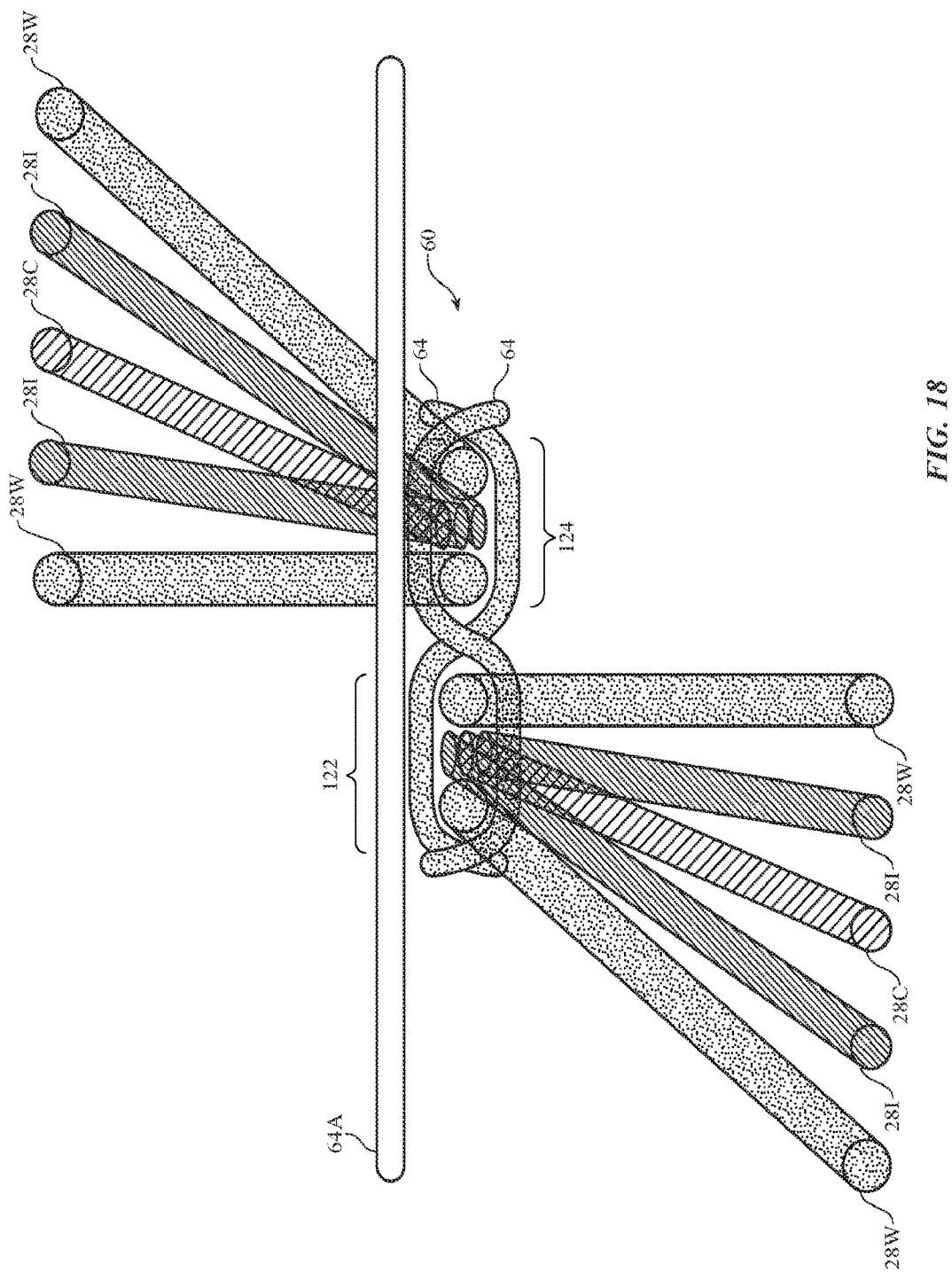

A weft strand such as weft strand 64A may then be introduced along direction X using weft strand positioning equipment 64. FIG. 17 shows strand 64A as strand 64A is first being introduced. FIG. 18 shows stand 64A after strand 64A has crossed all warp strands 28. Strand 64A may be insulating or conductive.

Figure 19:
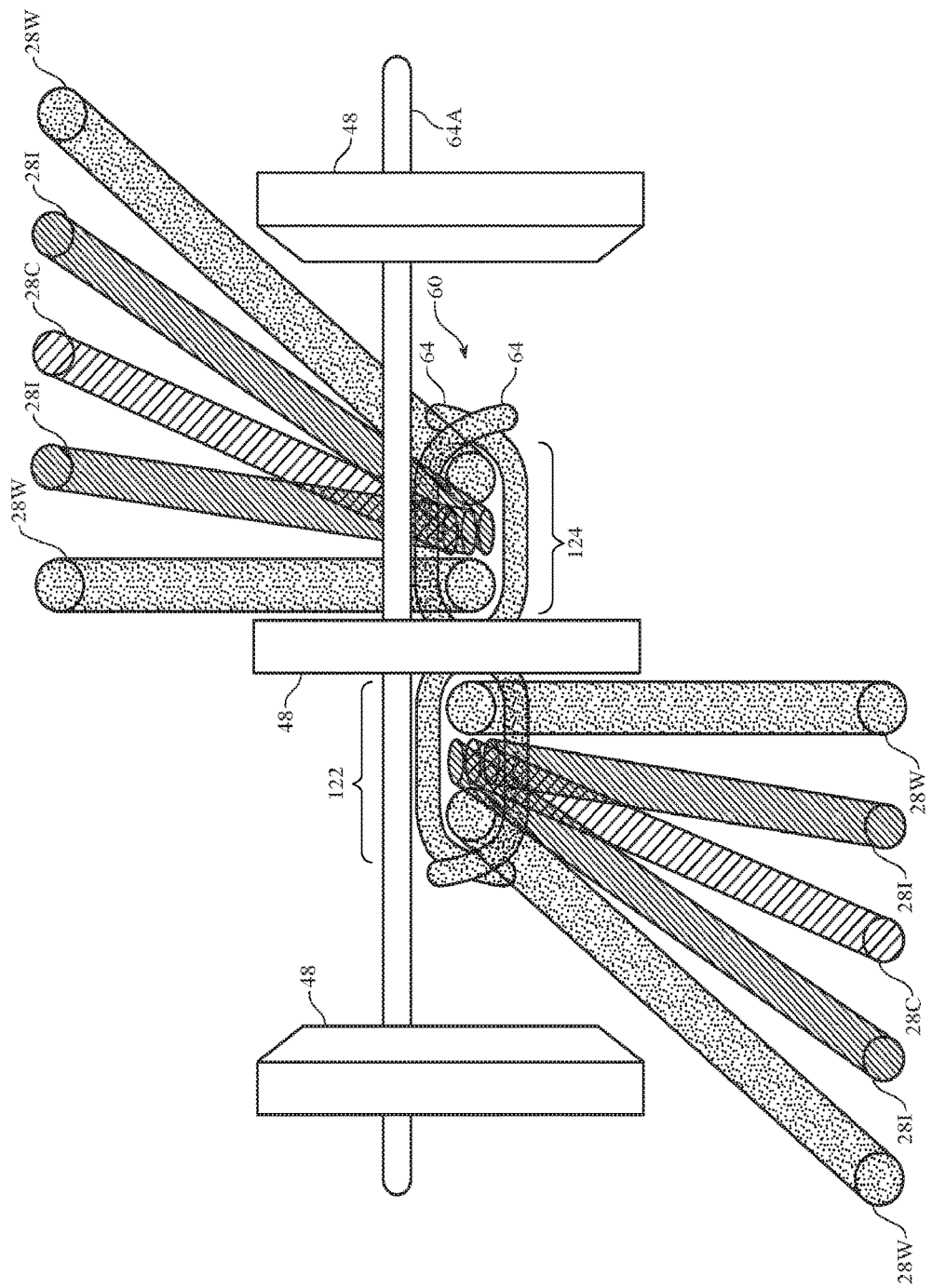
Figure 20:
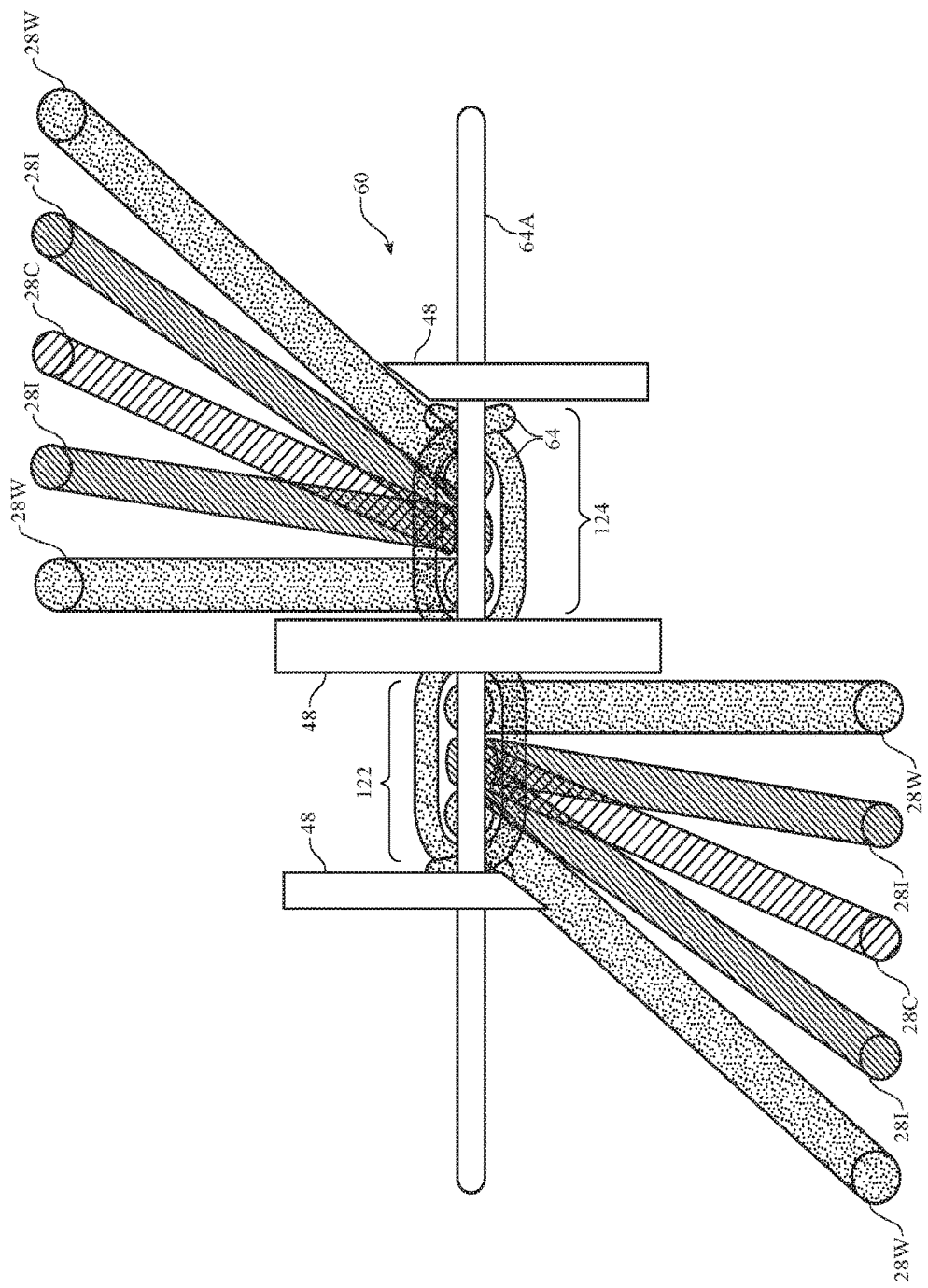
Figure 21:
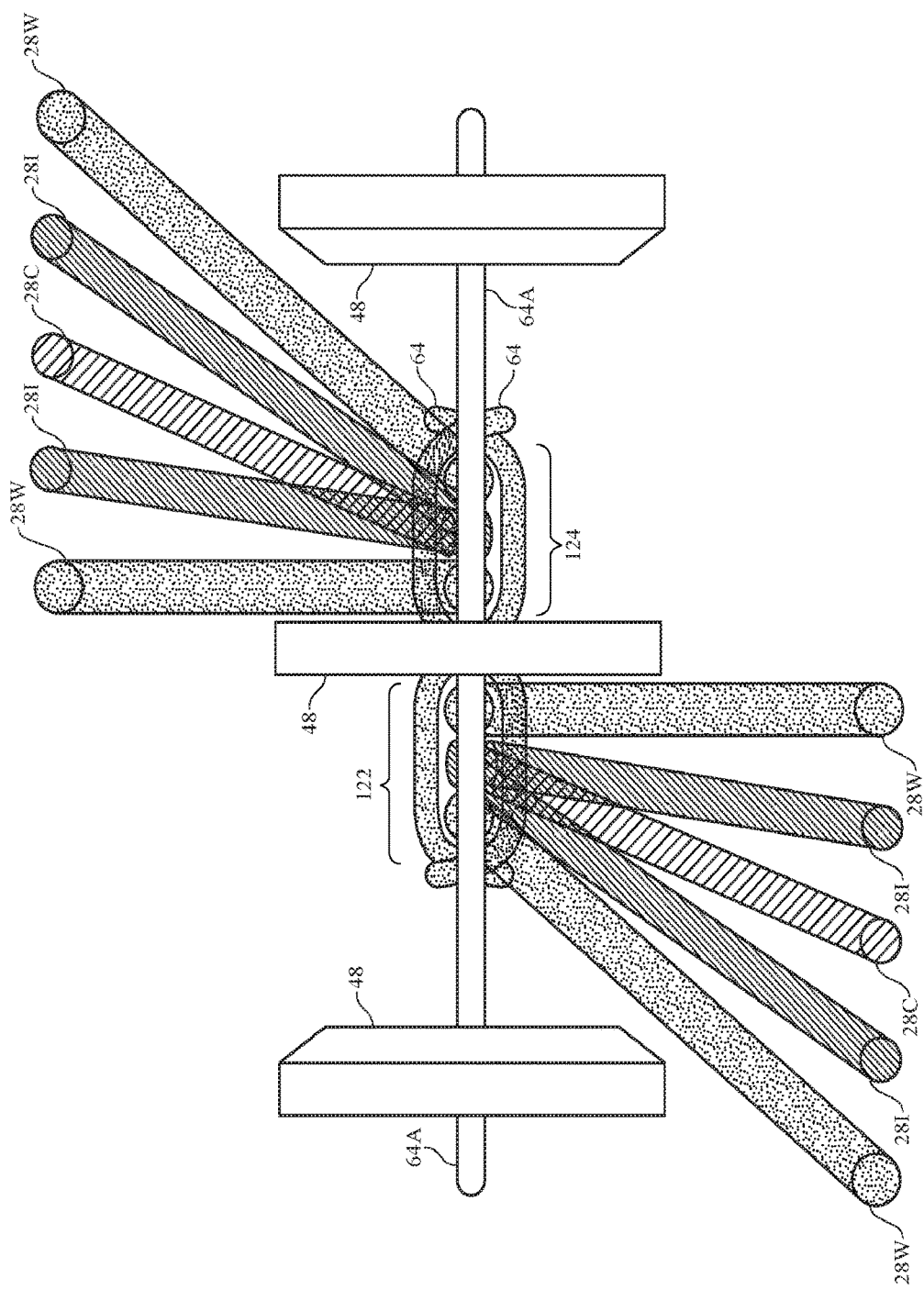
Figure 22:
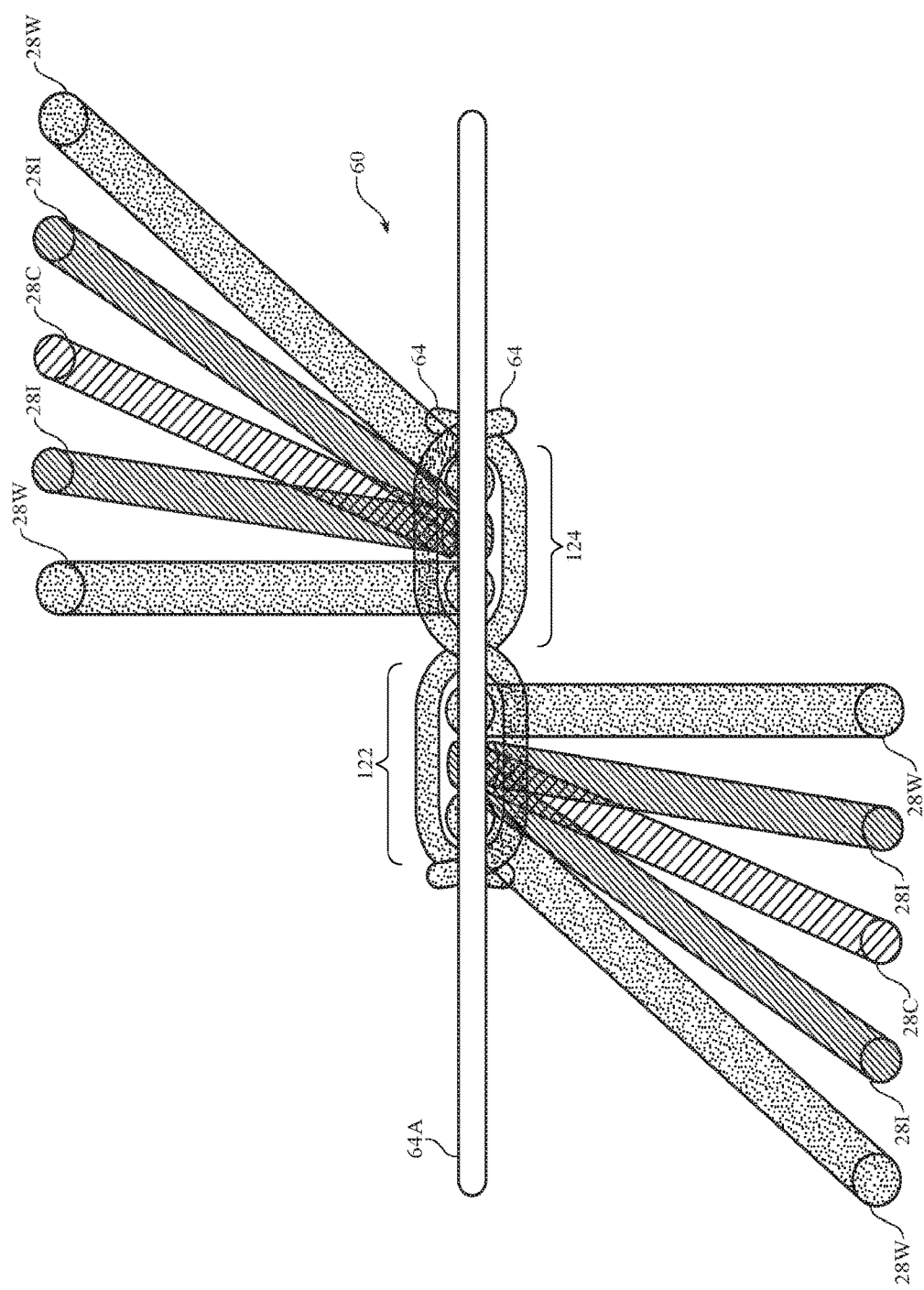

FIGS. 19, 20, and 21 show how reed 48 may be used to push strand 64A into place. FIG. 19 shows reed 48 in its initial position, which is away from strand 64A. FIG. 20 shows reed 48 when reed 48 is pushing strand 64A against fabric 60. FIG. 21 shows reed 48 after reed 48 has been pulled back after finishing the process of pushing strand 64A against fabric 60. In the configuration of FIG. 22, reed 48 has been withdrawn so that the warp strands can be repositioned.

Figure 23:
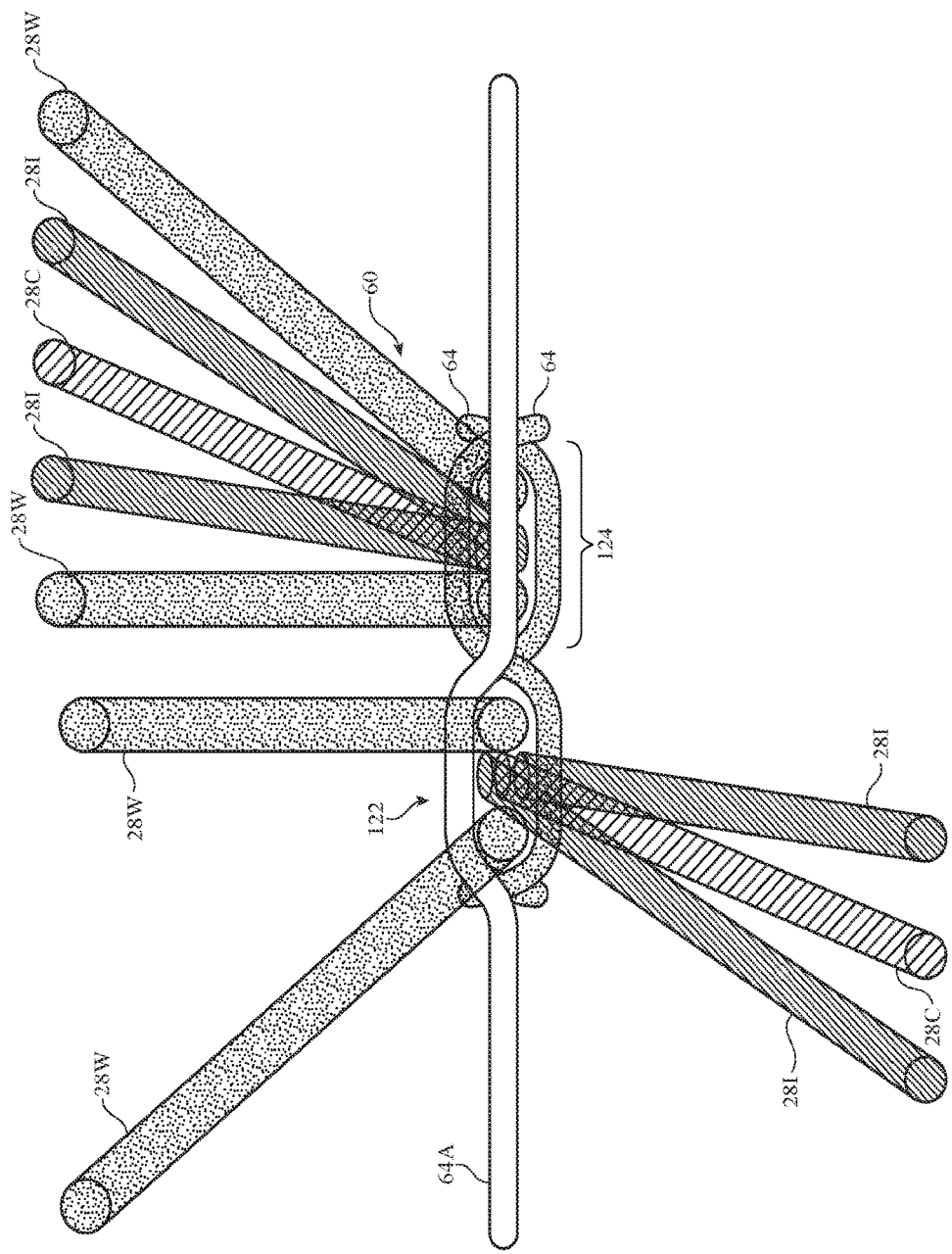
Figure 24:
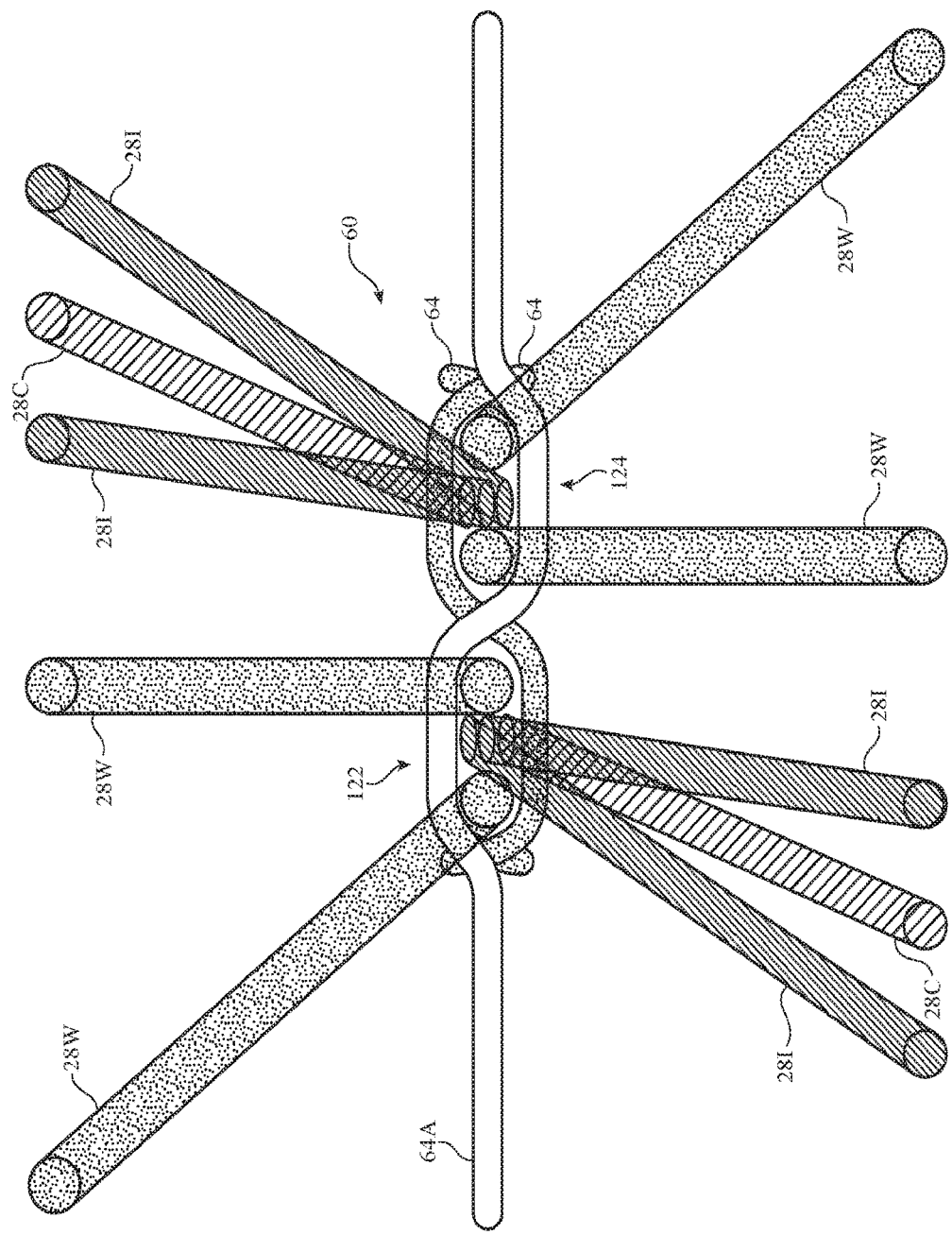
Figure 25:
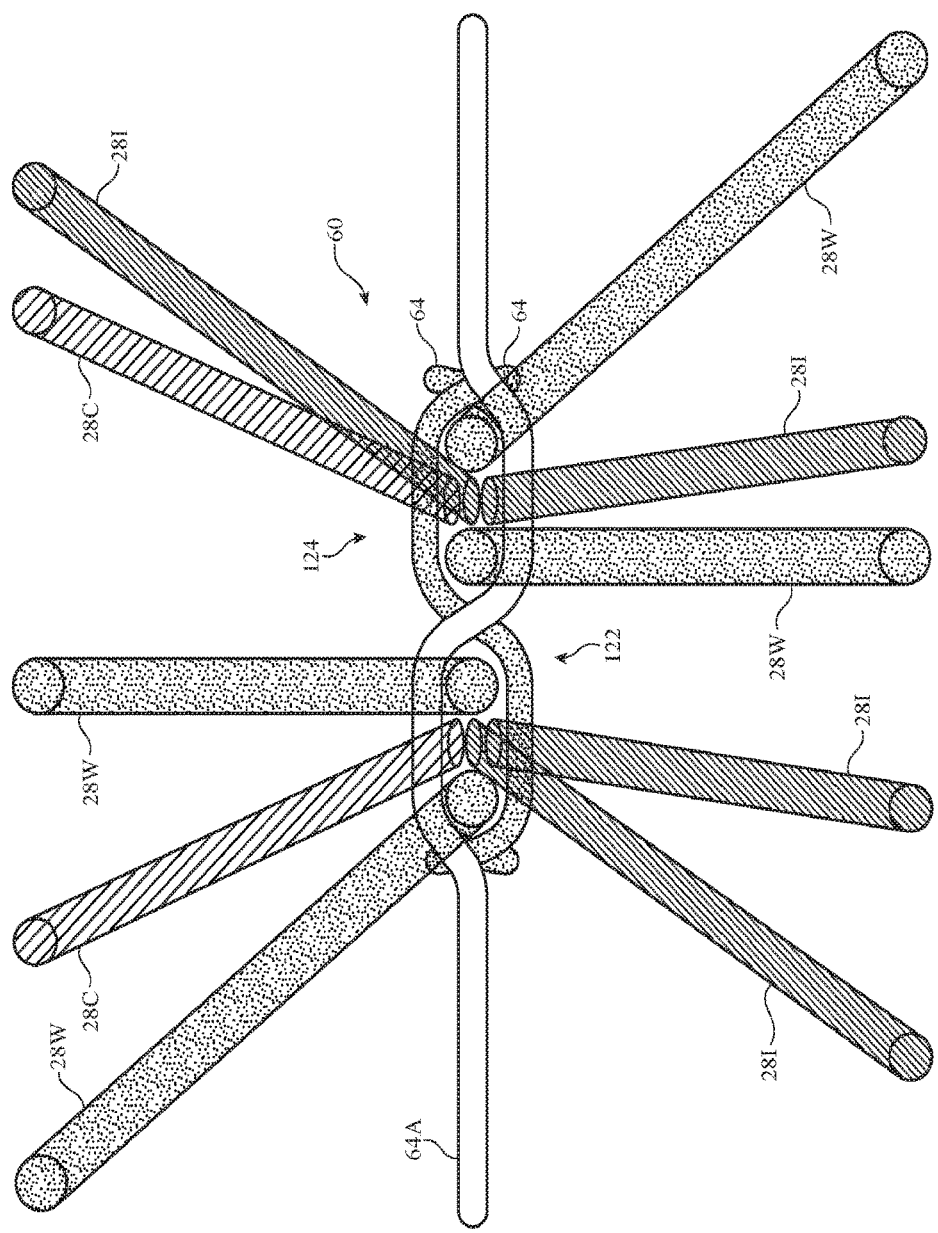
Figure 26:
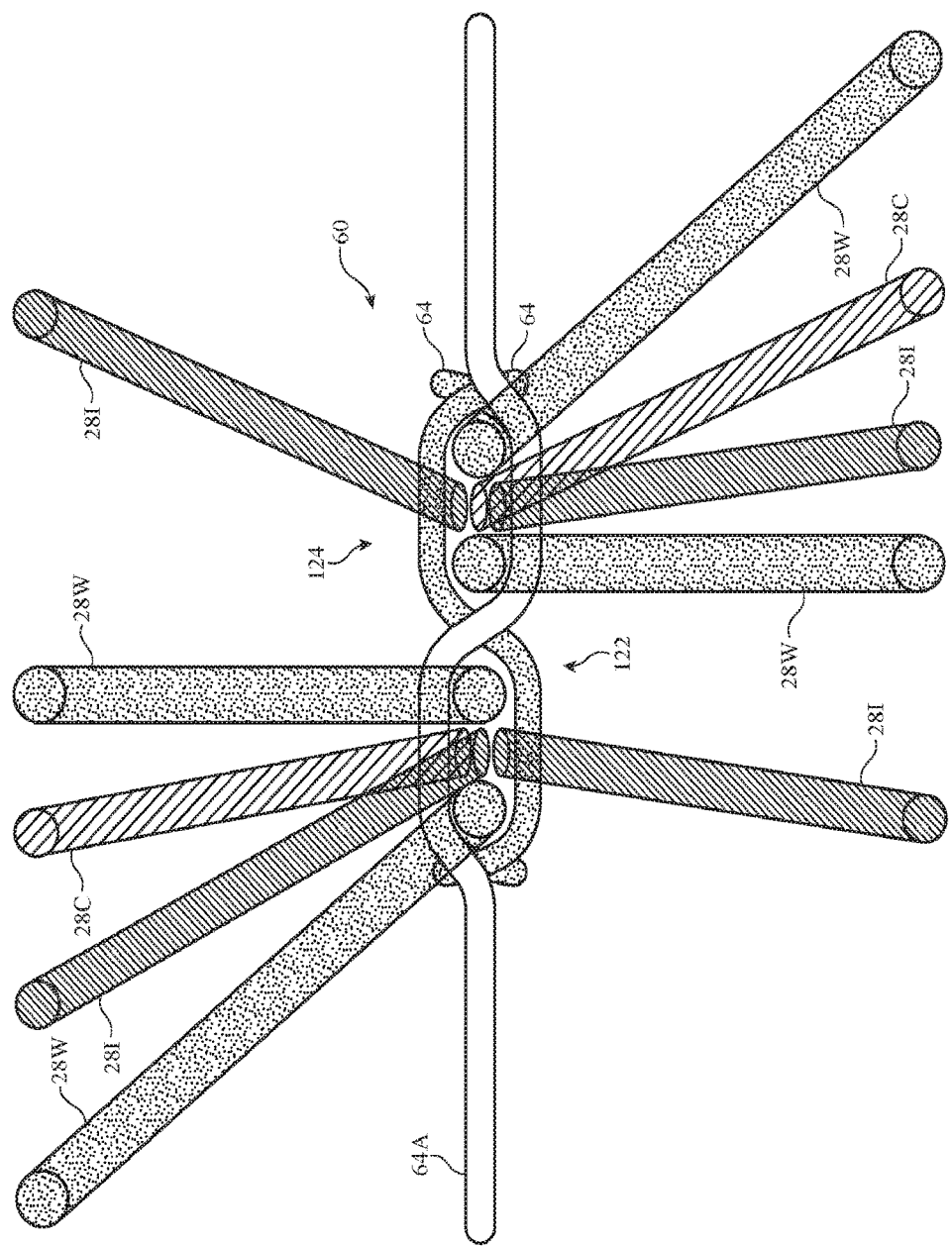
Figure 27:
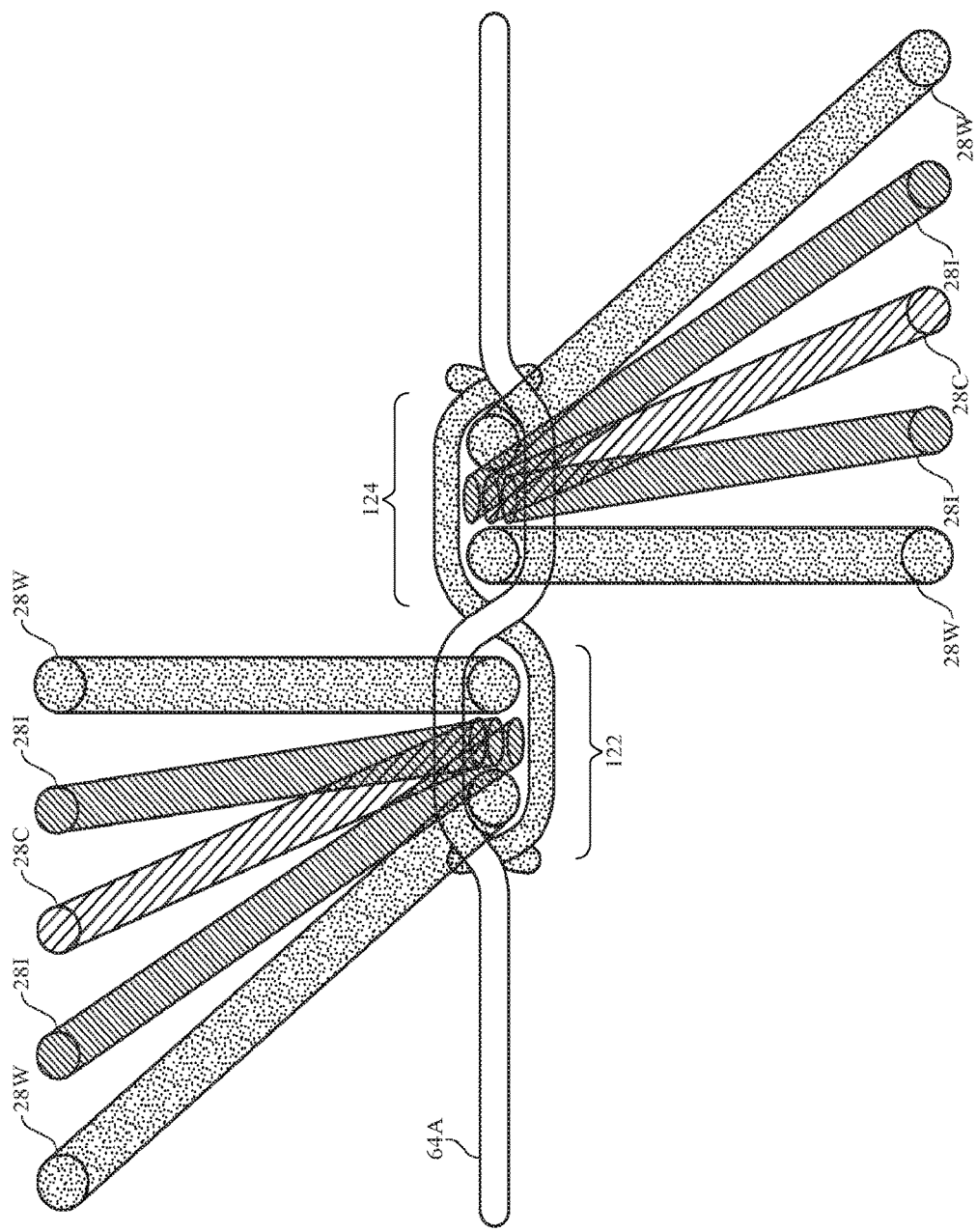

In a first step following the withdrawal of reed 48, wall strands 28W in region 122 are moved upwards, as shown in FIG. 23.

In a second step (FIG. 24), wall strands 28W in region 124 are moved downwards.

In a third step (FIG. 25), conductive warp strand 28C is moved upwards in region 122 and a first insulating warp strand 28I is moved downwards in region 124.

In a fourth step (FIG. 26), a first insulating warp strand 28I is moved upwards in region 122 and conductive warp strand 28C is more downwards in region 124.

In a fifth step (FIG. 27), a second of the insulating warp strands 28I in region 122 is moved up and a second of the insulating warp strands 28I in region 124 is moved down. At the completion of this step, the stack of warp strands in region 122 has an upper strand that is conductive (strand 28C) and two lower strands that are insulating (strands 28I) and corresponds to the configuration of region 122 of FIG. 15, whereas the stack of warp strands in region 124 has a central conductive strand 28C sandwiched between opposing upper and lower insulating strands 28I and corresponds to the configuration of region 124 in FIG. 15.

Additional picks such as the illustrative pick illustrated in FIGS. 14-27 (with the same warp strand movements or other suitable movements) may be performed to complete the process of forming fabric 60. As the example of FIGS. 14-27 demonstrates, warp strand placement within the warp strand stacks (i.e., the stacks of three warp strands between opposing weft strands in the examples of FIGS. 14-27) is controlled by controlling the relative timing of the warp strand position (shed height) for each of the warp strands.

Figure 28:
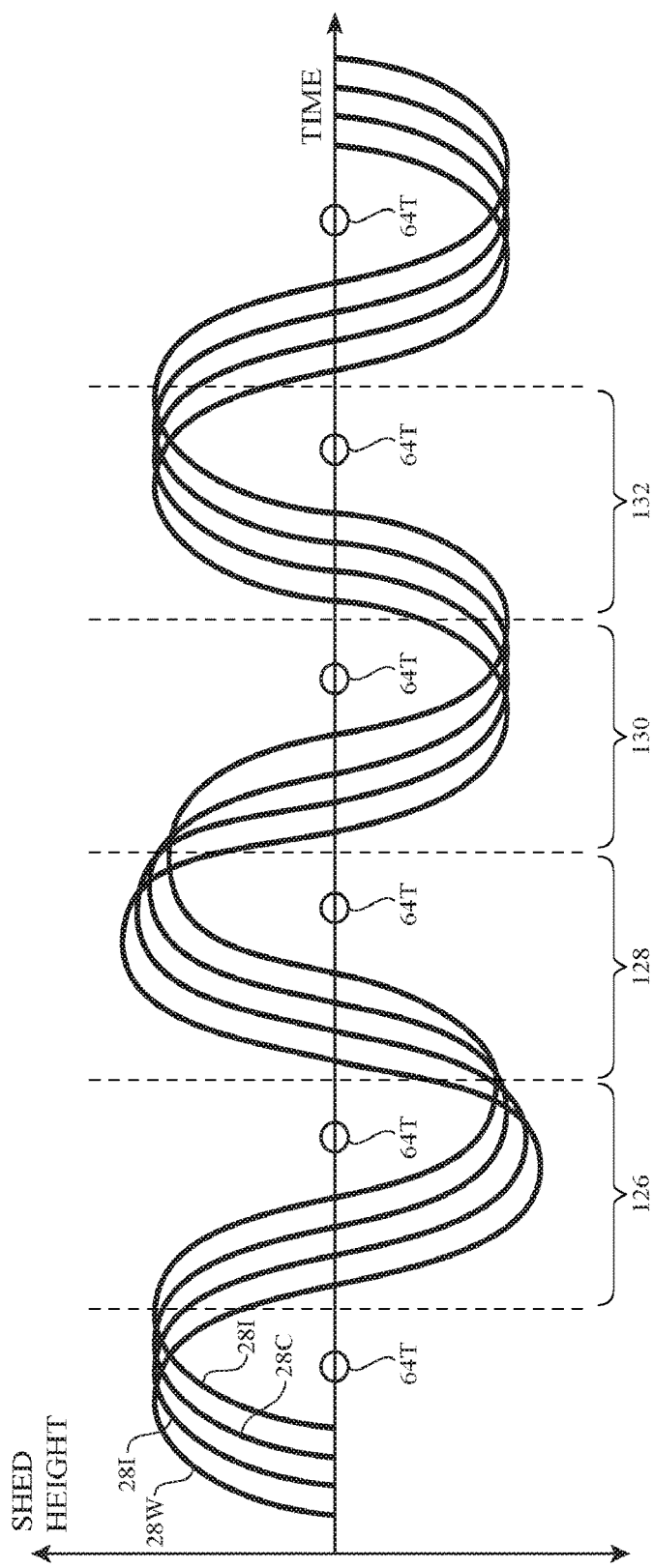
FIG. 28 is a graph in which warp strand position has been plotted as a function of time for several different types of warp strands in a fabric that is being woven in accordance with an embodiment.

FIG. 28 is graph in which warp strand vertical position (shed height) has been plotted as a function of time for an illustrative fabric containing a pair of wall strands 28W and a stack of three warp strands (two insulating strands 28I and one conductive strand 28C) between the wall strands. The times at which the weft strands are inserted is given by weft strand insertion time 64T. The graph of FIG. 28 illustrates how different types of regions may be created in fabric 60 by controlling warp strand placement. In each pick, the wall warp strands 28W are positioned first, thereby creating a gap into which a stack of strands 28I and 28C may be placed.

In pick 126, the warp strands are being positioned to pass under the weft strand. Conductive warp strand 28C is sandwiched between a pair of insulating warp strands 28I. Pick 126 therefore creates an insulated back (lower surface) portion of fabric 60.

In pick 128, the warp strands are passing over the weft strand. Conductive warp strand 28C is again sandwiched between a pair of insulating warp strands 28I. Pick 128 therefore creates an insulated front (upper surface) portion of fabric 60.

In pick 130, the warp strands are passing under the weft strand. Conductive warp strand 28C is inserted into the gap between wall strands 28W before the two insulating strands 28I, so pick 130 produces a region of fabric 60 in which conductive warp strand 28W is exposed on the back of fabric 60.

In pick 132, the warp strands are passing over the weft strand. Conductive warp strand 28C is inserted into the gap between wall strands 28W before the two insulating strands 28I, so pick 132 produces a region of fabric 60 in which conductive warp strand 28W is exposed on the front of fabric 60.

Although the graph of FIG. 28 shows how different regions of fabric 60 may be formed using weaving techniques, conductive and insulating strands may likewise be selectively exposed on the front and back of a knitted fabric, in braided items, etc. Using weaving techniques to form fabric regions with both insulating and conductive exposed regions is merely illustrative.

It may be desirable to form fabric 60 with a weave such as a single-layer weave that allows selective open circuits and short circuits to be formed where conductive warp and weft strands intersect. Consider, as an example, the warp and weft intersections of FIGS. 29 and 30. In the illustrative configuration of FIG. 29, conductive warp strand 28C and conductive weft strand 64C intersect (i.e., strands 28C and 64C cross each other at a right angle or other suitable non-zero angle) but do not electrically connect. As a result, warp strand 28C and weft strand 64C form an open circuit at intersection 136 of FIG. 29. In the illustrative configuration of FIG. 30, strands 28C and 64C physically and electrically connect to each other at intersection 136 (i.e., intersection 136 is a short circuit).

Figure 29:
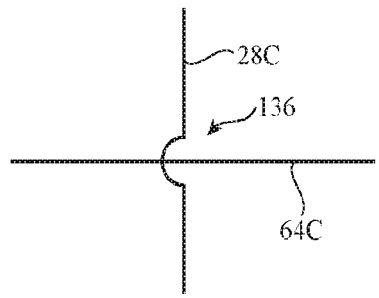
FIG. 29 is a diagram of an illustrative open circuit intersection between conductive strands in accordance with an embodiment.
Figure 30:
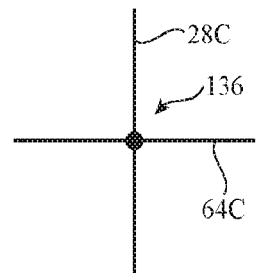
FIG. 30 is a diagram of an illustrative short circuit intersection between conductive strands in accordance with an embodiment.
Figure 31:
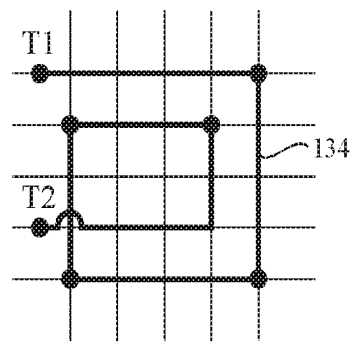
FIG. 31 is a diagram of a portion of a fabric in which a conductive path has been configured to form an inductor in accordance with an embodiment.

Signal paths may be formed within fabric 60 using a desired pattern of open circuit intersections of the type shown in FIG. 29 and short circuit intersections of the type shown in FIG. 30. As an example, an inductor such as inductor 134 of FIG. 31 may be formed by creating a spiral conductive path that terminates at terminals T1 and T2. in this way (e.g., to form busses and other signal routing paths).

Figure 32:
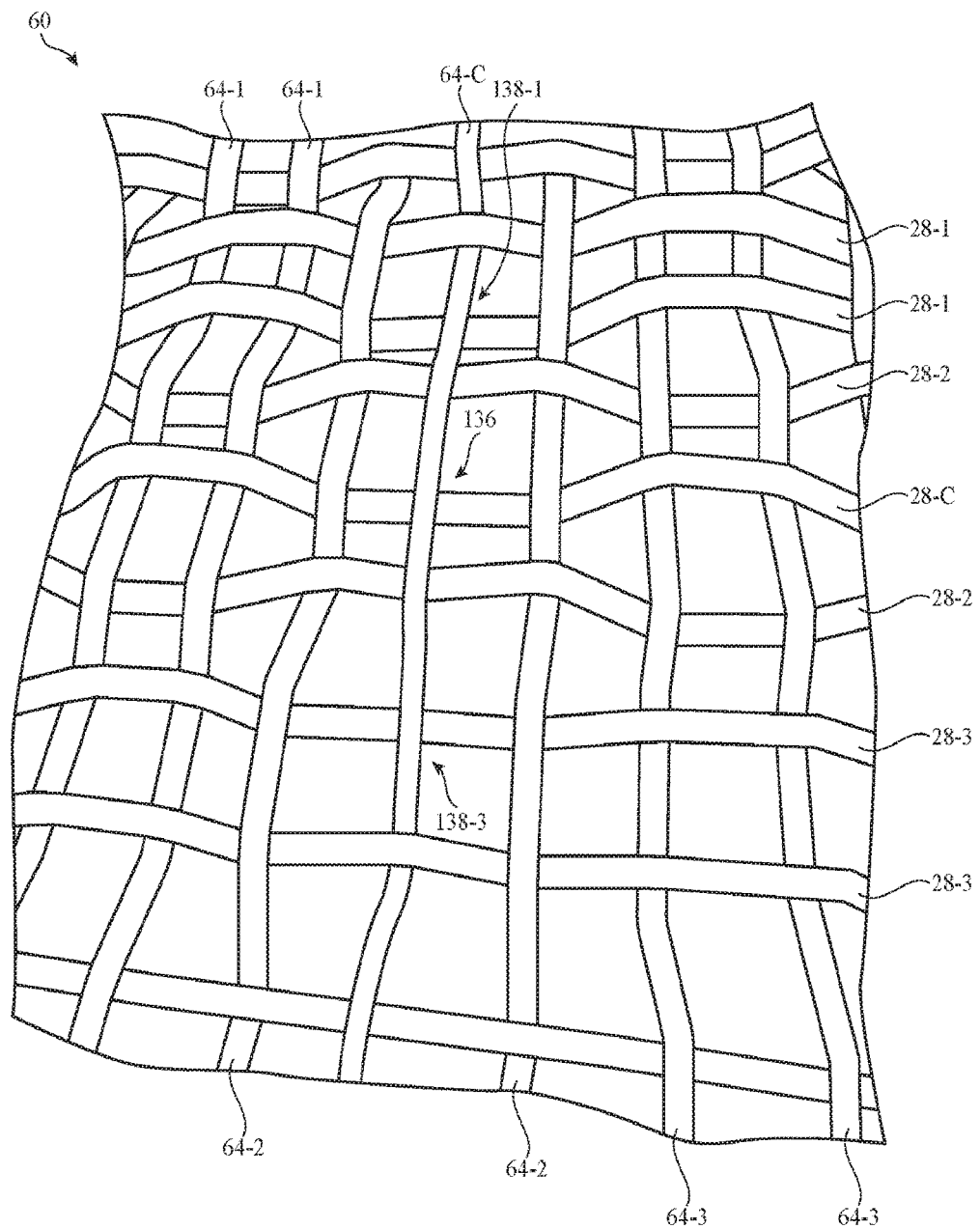
FIG. 32 is perspective view of illustrative fabric formed from interwoven pairs of insulating warp and weft strands and conductive strands that run along the centers of the warp and weft strand pairs in accordance with an embodiment.

An illustrative woven fabric of the type that may be provided with selectively formed open circuit and short circuit conductive strand intersections is shown in FIG. 32. As shown in FIG. 32, fabric 60 may contain multiple sets of insulating weft strands interwoven with multiple orthogonal sets of insulating warp strands using a basket weave pattern. In FIG. 32, there are three pairs of insulating weft strands 64-1, 64-2, and 64-3 and three interwoven orthogonal pairs of insulating warp strands 28-1, 28-2, and 28-3. In this example, each set of insulating weft strands includes two weft strands and each set of interwoven insulating warp strands includes two warp strands. More insulating weft and/or warp strands may be provided in each set if desired.

Conductive warp strands (e.g., bare metal strands) may be inserted within some of the warp strand pairs and conductive weft strand pairs may be inserted within some of the weft strand pairs. In the illustrative configuration of FIG. 32, conductive weft strand 64C has been inserted in the middle of weft strands 64-2 and conductive warp strand 28C has been inserted in the middle of warp strands 28-2.

The conductive warp and weft strands intersect at intersections such as intersection 136 of FIG. 32. When it is desired to form an open circuit between conductive weft strand 64C and conductive warp strand 28C at intersection 136, the insulating strands adjacent to intersection 136 are interposed between strands 64C and 28C. As shown in FIG. 32, for example, insulating warp strands 28-2 and insulating weft strands 64-2 may be used to hold conductive strands 64C and 28C apart from each other. When it is desired to form a short circuit between weft strand 64C and conductive warp strand 28C at intersection 136, weft strand 64C may be configured to contact strand 28C (i.e., strand 64C may pass under strand 28C at intersection 136 of FIG. 32).

In the example of FIG. 32, each insulating weft strand passes over two insulating warp strands and then under two insulating warp strands in a repeating pattern. Similarly, each insulating warp strand passes over two insulating weft strands before passing under two insulating weft strands in a repeating pattern. Conductive strands 64C and 28C may follow the same pattern or may follow different paths. In the example of FIG. 32, warp strand 28C passes alternately over and under pairs of insulating weft strands, but weft strand 64C passes over one of warp strands 28-1 at intersection 138-1 (i.e., the warp strand 28-1 that is closest to intersection 136) and passes under the other of warp strands 28-1 and weft strand 64C also passes over one of warp strands 28-3 at intersection 138-3 (i.e., the warp strand 28-3 that is closest to intersection 136) and passes under the other of warp strands 28-3. If desired, fabric 60 could be configured so that strand 64C passes under strand 28-1 at intersection 138-1 and so that strand 64C passes under strand 28-3 at intersection 138-3. The arrangement of FIG. 32 is merely illustrative.

Figure 33:
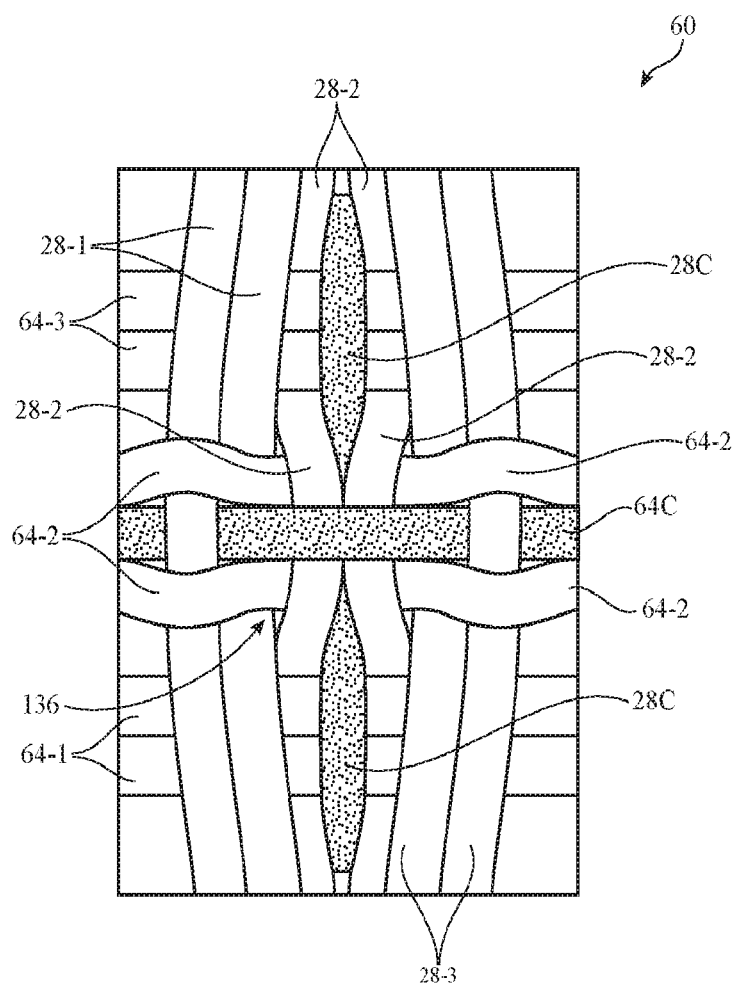
FIG. 33 is a front view of a portion of the illustrative fabric of FIG. 32 at an illustrative open circuit intersection in accordance with an embodiment.
Figure 34:
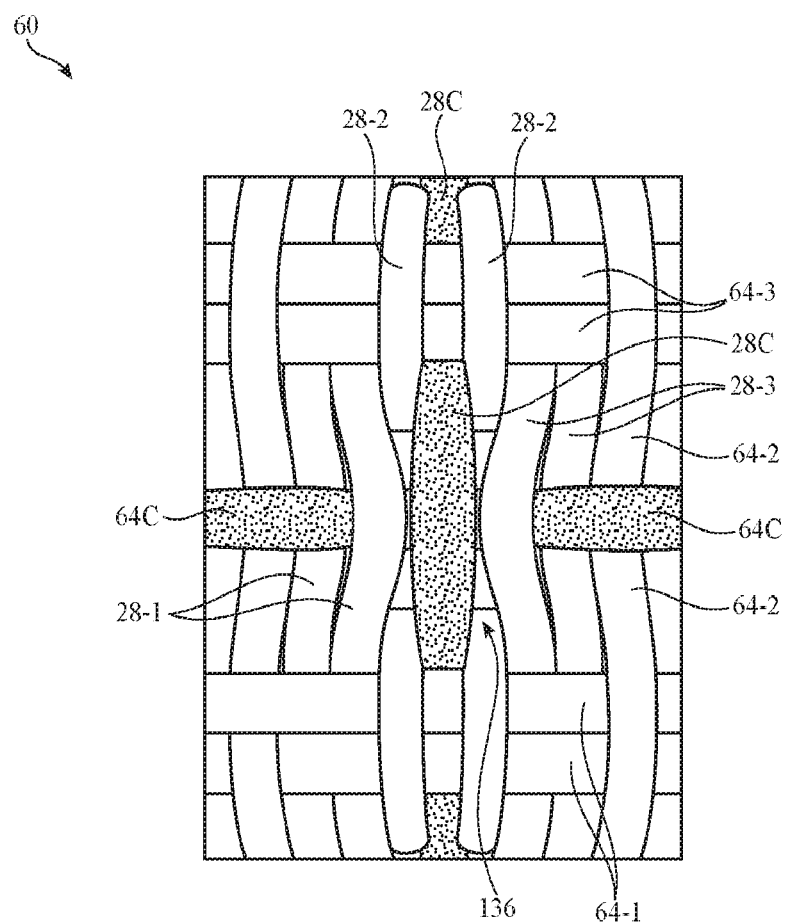
FIG. 34 is a rear view of a portion of the illustrative fabric of FIG. 32 at an illustrative open circuit intersection in accordance with an embodiment.

FIGS. 33 and 34 are respectively front and rear views of a fabric such as fabric 60 of FIG. 32 in the vicinity of an illustrative open circuit intersection 136. As shown in FIGS. 33 and 34, insulating strands 64-2 and 28-2 are drawn into the area between conductive strands 64C and 28C at illustrative open circuit intersection 136, thereby preventing contact between conductive strands 64C and 28C.

Figure 35:
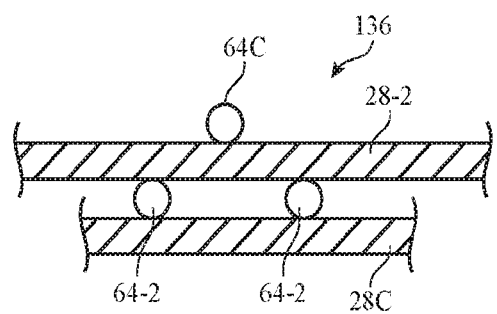
FIG. 35 is a cross-sectional side view of the open circuit intersection of FIG. 33 in accordance with an embodiment.
Figure 36:
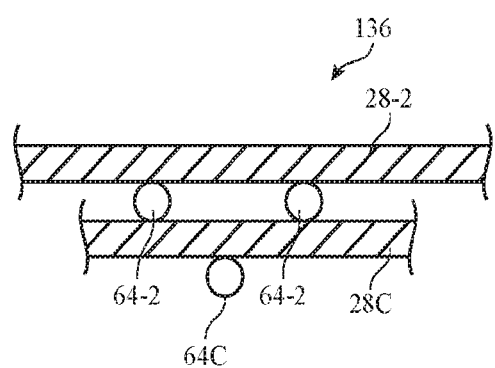
FIG. 36 is a cross-sectional side view of the closed circuit intersection of FIG. 34 in accordance with an embodiment.

Cross-sectional side views of fabric 60 of FIG. 32 at a short circuit intersection and an open circuit intersection are shown respectively in FIGS. 35 and 36. As shown by the illustrative open circuit intersection 136 of FIG. 35, there are two layers of interposed insulating strands 28-2 and 64-2 that separate conductive strands 64C and 28C at the open circuit intersection. As shown by the illustrative short circuit intersection 136 of FIG. 36, a short circuit connection between strands 28C and 64C may be formed by passing strand 64C under strand 28C so that strands 28C and 64C are pulled towards each other and form a satisfactory electrical contact.

If desired, circuitry 16 may contain touch sensor array controller circuitry that emits drive signals onto a first set of conductive electrodes and that gathers and processes corresponding sense signals on a second set of conductive electrodes (e.g., overlapping electrodes or other electrodes that are associated with the first set of electrodes). The touch sensor array controller circuitry can emit the drive signals and can process the sense signals to gather touch input data (e.g., information on where a user's fingers or other external objects are located in lateral dimensions X and Y on a touch sensor formed from an array of the electrodes). In fabric-based device 10, touch sensor electrodes may be formed from conductive paths that are selectively formed within fabric 60. As an example, drive lines may be formed from conductive strands 28C and sense lines may be formed from orthogonal conductive strands 64C (or vice versa). Conductive strands 28C and 64C may intersect at open circuit intersections 136. Due to the intervening insulating strands, the separation between conductive strands 28C and 64C will and the capacitance associated with this separation in the absence of a nearby external object will be well defined at each intersection. In this type of configuration, capacitive touch sensor data may be gathered at each intersection and, when processed by circuitry 16, can be used to supply item 10 or other equipment (e.g., item 18) with touch sensor data (e.g., data on multi-touch gestures, single-touch gestures, etc.). Conductive strands 28C and 64C may also be used in forming other conductive structures in fabric 60 and item 10 (e.g., structures for a resistive sensor in a switch or touch sensor or structures for other electrical components). The use of fabric 60 to form a capacitive touch sensor is merely illustrative. If desired, fabric such as the fabric described in connection with FIGS. 3-28 may be used in forming a capacitive touch sensor, resistive sensor, or other component (e.g., by selectively exposing conductive stacked strands to the front or back surfaces of fabric 60, etc.).

The weaving techniques used in forming fabric 60 may be used in forming single-strand signal paths, signal paths that use patches of conductive strands to form electrodes or other structure, or other conductive paths.

In accordance with an embodiment, a fabric is provided that includes first strands that run along a first dimension, and interwoven second strands that run along a second dimension that is orthogonal to the first dimension, the second strands include pairs of insulating strands that are interwoven with the first strands and include stacked strands located between opposing first and second insulating strands in each pair of insulating strands and wherein the stacked strands include conductive and insulating stacked strands.

In accordance with another embodiment, the fabric has at least one portion in which one of the conductive stacked strands is sandwiched between a pair of the insulating stacked strands.

In accordance with another embodiment, at least one of the first strands is a conductive first strand.

In accordance with another embodiment, the conductive first strand and the conductive stacked strand intersect at an open circuit intersection in which the conductive first strand and the conductive stacked strand are isolated from each other.

In accordance with another embodiment, the conductive first strand and the conductive stacked strand are isolated from each other by one of the insulating stacked strands at the open circuit intersection.

In accordance with another embodiment, the fabric includes first and second fabric layers, the first and second strands are in the first layer.

In accordance with another embodiment, the fabric has opposing first and second surfaces and has at least one portion in which one of the conductive stacked strands is positioned above a pair of the insulating stacked strands and is exposed at the first surface.

In accordance with another embodiment, at least one of the first strands is a conductive first strand.

In accordance with another embodiment, the conductive first strand and the conductive stacked strand intersect at a short circuit intersection in which the conductive first strand and the conductive stacked strand contact each other and are shorted to each other.

In accordance with another embodiment, the fabric includes first and second fabric layers, where the first and second strands are in the first layer.

In accordance with another embodiment, the first strands are weft strands and the second strands are warp strands.

In accordance with another embodiment, the conductive stacked strands include bare metal wires.

In accordance with another embodiment, at least one of the conductive stacked strands forms at least part of a capacitive touch sensor electrode.

In accordance with an embodiment, a fabric is provided that includes first pairs of insulating strands interwoven with second pairs of insulating strands, the first pairs of insulating strands extend along a first dimension and the second pairs of insulating strands extend along a second dimension that is orthogonal to the first dimension, a first conductive strand that extends along the first dimension and that is interposed between first and second insulating strands in one of the first pairs of insulating strands, and a second conductive strand that extends along the second dimension and that is interposed between first and second insulating strands in one of the second pairs of insulating strands.

In accordance with another embodiment, the first conductive strand and the second conductive strand cross each other at an open circuit intersection in which the first and second conductive strands do not contact each other.

In accordance with another embodiment, the first and second conductive strands are held apart at the open circuit intersection by one of the first pairs of insulating strands and by one of the second pairs of insulating strands.

In accordance with another embodiment, the first and second conductive strands include bare metal wire.

In accordance with another embodiment, the first conductive strand and the second conductive strand cross each other at a short circuit intersection in which the first and second strands contact each other and are electrically shorted to each other.

In accordance with another embodiment, the first and second conductive strands include bare metal wire.

In accordance with another embodiment, at least one of the first and second conductive strands forms at least part of a capacitive touch sensor electrode.

In accordance with an embodiment, a fabric is provided that includes insulating warp strands that extend along a first dimension, and interwoven insulating weft strands that extend along a second dimension that is orthogonal to the first dimension, the insulating warp strands include pairs of insulating warp strands, the insulating weft strands include pairs of insulating weft strands, and the pairs of insulating warp strands and the pairs of insulating weft strands are interwoven, and a conductive warp strand that extends along the first dimension and that lies between the insulating wrap strands in one of the pairs of insulating warp strands, and a conductive weft strand that extends along the second dimension and that lies between the insulating weft strands in one of the pairs of insulating weft strands.

In accordance with another embodiment, the pairs of insulating warp strands and the pairs of insulating weft strands are interwoven in a basket weave and the conductive warp and weft strands intersect at an open circuit intersection and are held apart by some of the insulating warp and weft strands.

In accordance with another embodiment, the pairs of insulating warp strands and the pairs of insulating weft strands are interwoven in a basket weave and the conductive warp and weft strands intersect at a short circuit intersection in which the conductive warp and weft strands contact each other.

The foregoing is merely illustrative and various modifications can be made by those skilled in the art without departing from the scope and spirit of the described embodiments. The foregoing embodiments may be implemented individually or in any combination.

What is claimed is:

1. A fabric, comprising:
   weft strands that run along a first dimension, wherein the weft strands include a conductive weft strand and an insulating weft strand that is adjacent to the conductive weft strand; and
   interwoven warp strands that run along a second dimension that is orthogonal to the first dimension, wherein the warp strands include:
      first and second insulating strands that are interwoven with the weft strands; and
      stacked strands that form a stack extending in a third dimension that is orthogonal to the first and second dimensions, wherein the stacked strands are interposed between the first and second insulating strands such that the first and second insulating strands hold the stacked strands in the stack, wherein the fabric has at least one portion in which the stacked strands include a conductive stacked strand sandwiched between two insulating stacked strands to form an open circuit connection at which the conductive weft strand and the conductive stacked strand overlap and are isolated from each other by one of the two insulating stacked strands, and wherein the stacked strands and the first and second insulating strands are located between the conductive weft strand and the insulating weft strand.

2. The fabric defined in claim 1 further comprising first and second fabric layers, wherein the weft and warp strands form part of the first fabric layer.

3. The fabric defined in claim 1 wherein the stacked strands include an additional conductive stacked strand and two additional insulating stacked strands and wherein the fabric has opposing first and second surfaces and has at least one additional portion in which the additional conductive stacked strand is positioned above the two additional insulating stacked strands and is exposed at the first surface.

4. The fabric defined in claim 3 wherein at least one of the weft strands is an additional conductive weft strand.

5. The fabric defined in claim 4 wherein the additional conductive weft strand and the additional conductive stacked strand intersect at a short circuit intersection in which the additional conductive weft strand and the additional conductive stacked strand contact each other and are shorted to each other.

6. The fabric defined in claim 5 further comprising first and second fabric layers, wherein the weft and warp strands form part of the first fabric layer.

7. The fabric defined in claim 1 wherein the conductive stacked strand comprises a bare metal wire.

8. The fabric defined in claim 1 wherein the conductive stacked strand forms at least part of a capacitive touch sensor electrode.

9. A fabric comprising:
   insulating weft strands interwoven with insulating warp strands, wherein the insulating weft strands extend along a first dimension and the insulating warp strands extend along a second dimension that is orthogonal to the first dimension;
   a conductive weft strand that extends along the first dimension and that is interposed between two of the insulating weft strands; and
   stacked warp strands that extend along the second dimension and that include a conductive stacked strand interposed between two insulating stacked strands, wherein the conductive weft strand and the conductive stacked strand cross each other at an open circuit intersection in which the conductive weft strand and the conductive stacked strand do not contact each other, and wherein the conductive weft strand and the conductive stacked strand are held apart at the open circuit intersection by one of the insulating stacked strands, wherein the insulating warp strands include first and second insulating warp strands that hold the stacked strands in a stack that extends in a third dimension that is orthogonal to the first and second dimensions, and wherein the stack and the first and second insulating warp strands are located between the conductive weft strand and one of the two insulating weft strands.

10. The fabric defined in claim 9 wherein the conductive weft strand and the conductive stacked strand comprise bare metal wire.

11. The fabric defined in claim 9 further comprising:
   an additional conductive weft strand that extends along the first dimension and that is interposed between two additional ones of the insulating weft strands, wherein the stacked strands include an additional conductive stacked strand that extends along the second dimension and that is interposed between two additional insulating stacked strands, wherein the additional conductive weft strand and the additional conductive stacked strand cross each other at a short circuit intersection in which the additional conductive weft strand and the additional conductive stacked strand contact each other and are electrically shorted to each other.

12. The fabric defined in claim 11 wherein the additional conductive weft strand and the additional conductive stacked strand comprise bare metal wire.

13. The fabric defined in claim 9 wherein at least one of the conductive weft strand and the conductive stacked strand forms at least part of a capacitive touch sensor electrode.

14. A fabric, comprising:
- insulating warp strands that extend along a first dimension;
- insulating weft strands that extend along a second dimension that is orthogonal to the first dimension, wherein the insulating warp strands and the insulating weft strands are interwoven;
- a conductive warp strand that extends along the first dimension and that lies between two of the insulating warp strands;
- a conductive weft strand that extends along the second dimension and that lies between two of the insulating weft strands, wherein the insulating warp strands and the insulating weft strands are interwoven in a basket weave; and
- additional insulating warp strands that hold the conductive warp strand in a stack with at least two of the insulating warp strands, wherein the stack extends in a third dimension that is orthogonal to the first and second dimensions, wherein the conductive warp and weft strands overlap at an open circuit intersection and are held apart by at least one of the two insulating warp strands in the stack, and wherein the stack and the additional insulating warp strands are located between the conductive weft strand and one of the two insulating weft strands.

15. The fabric defined in claim 14 further comprising an additional conductive warp strand and an additional conductive weft strand that intersect at a short circuit intersection in which the additional conductive warp strand and the additional conductive weft strand contact each other.

* * * * *